(12) United States Patent
Chua et al.

(10) Patent No.: US 9,476,139 B2
(45) Date of Patent: Oct. 25, 2016

(54) CLEANING ELECTROPLATING SUBSTRATE HOLDERS USING REVERSE CURRENT DEPLATING

(71) Applicant: Novellus Systems, Inc., Fremont, CA (US)

(72) Inventors: Lee Peng Chua, Beaverton, OR (US); Steven T. Mayer, Aurora, OR (US); Thomas A. Ponnuswamy, Sherwood, OR (US); Santosh Kumar, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 881 days.

(21) Appl. No.: 13/853,935

(22) Filed: Mar. 29, 2013

(65) Prior Publication Data
US 2013/0256146 A1    Oct. 3, 2013

Related U.S. Application Data

(60) Provisional application No. 61/618,337, filed on Mar. 30, 2012.

(51) Int. Cl.
   C25F 1/00     (2006.01)
   C25D 17/00    (2006.01)
   (Continued)

(52) U.S. Cl.
   CPC ............... *C25F 1/00* (2013.01); *C25D 17/001* (2013.01); *C25D 17/06* (2013.01); *C25D 21/00* (2013.01); *C25D 21/12* (2013.01); *Y10S 901/02* (2013.01)

(58) Field of Classification Search
   CPC ....... C25F 1/00; C25D 17/001; C25D 17/06; C25D 21/00; C25D 21/12; Y10S 901/02
   See application file for complete search history.

(56) References Cited

U.S. PATENT DOCUMENTS

| 3,684,633 A | 8/1972 | Haase |
| 3,716,765 A | 2/1973 | Rueffer et al. |

(Continued)

FOREIGN PATENT DOCUMENTS

| CN | 1550033 A | 11/2004 |
| CN | 1623012 A | 6/2005 |

(Continued)

OTHER PUBLICATIONS

U.S. Appl. No. 14/990,725, titled "Multi-Contact Lipseals and Associated Electroplating Methods," filed Jan. 7, 2016.

(Continued)

*Primary Examiner* — Arun S Phasge
(74) *Attorney, Agent, or Firm* — Weaver Austin Villeneuve & Sampson LLP

(57) ABSTRACT

Provided are cleaning methods and systems to remove unintended metallic deposits from electroplating apparatuses using reverse current deplating techniques. Such cleaning involves positioning a cleaning (deplating) disk in an electroplating cup similar to a regular processed substrate. The front surface of the cleaning disk includes a corrosion resistant conductive material to form electrical connections to deposits on the cup's surfaces. The disk is sealed in the cup and submerged into a plating solution. A reverse current is then applied to the front conductive surface of the disk to initiate deplating of the deposits. Sealing compression in the cup may change during cleaning to cause different deformation of the lip seal and to form new electrical connections to the deposits. The proposed cleaning may be applied to remove deposits formed during electroplating of alloys, in particular, tin-silver alloys widely used for semiconductor and wafer level packaging.

29 Claims, 9 Drawing Sheets

(51) Int. Cl.
*C25D 17/06* (2006.01)
*C25D 21/00* (2006.01)
*C25D 21/12* (2006.01)

(56) References Cited

U.S. PATENT DOCUMENTS

| | | |
|---|---|---|
| 3,724,471 A | 4/1973 | Sitges |
| 4,418,432 A | 12/1983 | Vidal |
| 4,466,864 A | 8/1984 | Bacon et al. |
| 4,569,695 A | 2/1986 | Yamashita et al. |
| 4,924,891 A | 5/1990 | Soubrier et al. |
| 5,000,827 A | 3/1991 | Schuster et al. |
| 5,221,449 A | 6/1993 | Colgan et al. |
| 5,227,041 A | 7/1993 | Brogden et al. |
| 5,281,485 A | 1/1994 | Colgan et al. |
| 5,289,639 A | 3/1994 | Bard et al. |
| 5,311,634 A | 5/1994 | Andros |
| 5,482,611 A | 1/1996 | Helmer et al. |
| 5,519,945 A | 5/1996 | Ahvenniemi et al. |
| 5,723,028 A | 3/1998 | Poris |
| 5,853,559 A | 12/1998 | Tamaki et al. |
| 5,860,361 A | 1/1999 | Nanjyo et al. |
| 5,985,762 A | 11/1999 | Geffken et al. |
| 6,071,388 A | 6/2000 | Uzoh |
| 6,074,544 A | 6/2000 | Reid et al. |
| 6,080,291 A | 6/2000 | Woodruff et al. |
| 6,099,702 A | 8/2000 | Reid et al. |
| 6,108,847 A | 8/2000 | Cueman et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,176,985 B1 | 1/2001 | Downes, Jr. et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,217,716 B1 | 4/2001 | Lai |
| 6,221,757 B1 | 4/2001 | Schmidbauer et al. |
| 6,251,238 B1 | 6/2001 | Kaufman et al. |
| 6,251,242 B1 | 6/2001 | Fu et al. |
| 6,261,433 B1 | 7/2001 | Landau |
| 6,267,860 B1 | 7/2001 | Brodsky |
| 6,270,646 B1 | 8/2001 | Walton et al. |
| 6,274,008 B1 | 8/2001 | Gopalraja et al. |
| 6,277,249 B1 | 8/2001 | Gopalraja et al. |
| 6,303,010 B1 | 10/2001 | Woodruff et al. |
| 6,309,520 B1 | 10/2001 | Woodruff et al. |
| 6,379,468 B1 | 4/2002 | Chang et al. |
| RE37,749 E | 6/2002 | Poris |
| 6,413,388 B1 | 7/2002 | Uzoh et al. |
| 6,436,249 B1 | 8/2002 | Patton et al. |
| 6,517,689 B1 | 2/2003 | Hongo et al. |
| 6,540,899 B2 | 4/2003 | Keigler |
| 6,551,487 B1 | 4/2003 | Reid et al. |
| 6,579,430 B2 | 6/2003 | Davis et al. |
| 6,589,401 B1 | 7/2003 | Patton et al. |
| 6,612,915 B1 | 9/2003 | Uzoh et al. |
| 6,613,214 B2 | 9/2003 | Dordi et al. |
| 6,627,052 B2 | 9/2003 | Fluegel et al. |
| 6,755,946 B1 | 6/2004 | Patton et al. |
| 6,755,954 B2 | 6/2004 | Mayer et al. |
| 6,773,560 B2 | 8/2004 | Pedersen et al. |
| 6,800,187 B1 | 10/2004 | Reid et al. |
| 6,869,510 B2 | 3/2005 | Woodruff et al. |
| 6,908,540 B2 | 6/2005 | Kholodenko |
| 7,033,465 B1 | 4/2006 | Patton et al. |
| 7,070,686 B2 | 7/2006 | Contolini et al. |
| 7,087,144 B2 | 8/2006 | Herchen |
| 7,522,055 B2 | 4/2009 | Carrender et al. |
| 7,935,231 B2 | 5/2011 | Ghongadi et al. |
| 7,985,325 B2 | 7/2011 | Rash et al. |
| 8,172,992 B2 | 5/2012 | Prabhakar et al. |
| 8,377,268 B2 | 2/2013 | Rash et al. |
| 8,398,831 B2 | 3/2013 | Ghongadi et al. |
| 9,221,081 B1 | 12/2015 | Mayer et al. |
| 9,228,270 B2 | 1/2016 | Feng et al. |
| 2002/0000372 A1 | 1/2002 | Pedersen et al. |
| 2002/0084183 A1 | 7/2002 | Hanson et al. |
| 2002/0108851 A1 | 8/2002 | Woodruff et al. |
| 2002/0134403 A1 | 9/2002 | Selwyn et al. |
| 2002/0144900 A1 | 10/2002 | Keigler |
| 2002/0157686 A1 | 10/2002 | Kenny et al. |
| 2003/0010641 A1 | 1/2003 | Kholodenko |
| 2003/0085118 A1 | 5/2003 | Tench et al. |
| 2003/0085119 A1 | 5/2003 | Davis et al. |
| 2003/0134044 A1 | 7/2003 | Aoki et al. |
| 2003/0181349 A1 | 9/2003 | Maeno et al. |
| 2004/0002430 A1 | 1/2004 | Verhaverbeke |
| 2004/0060576 A1 | 4/2004 | Cronin et al. |
| 2004/0084301 A1 | 5/2004 | Dordi et al. |
| 2004/0112405 A1 | 6/2004 | Lee et al. |
| 2004/0149573 A1 | 8/2004 | Herchen |
| 2005/0081899 A1 | 4/2005 | Shannon |
| 2005/0183947 A1 | 8/2005 | Henuset |
| 2005/0218000 A1* | 10/2005 | Hafezi .......... C25D 21/12 205/86 |
| 2005/0284754 A1 | 12/2005 | Herchen et al. |
| 2005/0287928 A1 | 12/2005 | Hardikar et al. |
| 2006/0118132 A1 | 6/2006 | Bergman et al. |
| 2006/0151007 A1 | 7/2006 | Bergman |
| 2006/0226000 A1 | 10/2006 | Hanson et al. |
| 2006/0237308 A1 | 10/2006 | Herchen |
| 2006/0246690 A1 | 11/2006 | Dordi et al. |
| 2006/0266653 A1 | 11/2006 | Birang et al. |
| 2007/0077871 A1 | 4/2007 | Park et al. |
| 2007/0141849 A1 | 6/2007 | Kanno et al. |
| 2007/0199578 A1 | 8/2007 | Nomura et al. |
| 2008/0011322 A1 | 1/2008 | Weber et al. |
| 2008/0117051 A1 | 5/2008 | Carrender et al. |
| 2009/0107835 A1 | 4/2009 | Ghongadi et al. |
| 2009/0107836 A1 | 4/2009 | Rash et al. |
| 2009/0117730 A1 | 5/2009 | Maitani et al. |
| 2010/0116290 A1 | 5/2010 | Zhu et al. |
| 2010/0144158 A1 | 6/2010 | Ito et al. |
| 2010/0155254 A1 | 6/2010 | Prabhakar et al. |
| 2011/0181000 A1 | 7/2011 | Ghongadi et al. |
| 2011/0233056 A1 | 9/2011 | Rash et al. |
| 2012/0043200 A1 | 2/2012 | Fujikata et al. |
| 2012/0181170 A1 | 7/2012 | Prabhakar et al. |
| 2013/0042454 A1 | 2/2013 | Feng et al. |
| 2013/0292254 A1 | 11/2013 | Kumar et al. |
| 2014/0230855 A1 | 8/2014 | Mayer et al. |
| 2015/0218726 A1 | 8/2015 | Feng et al. |
| 2016/0145761 A1 | 5/2016 | Mayer et al. |

FOREIGN PATENT DOCUMENTS

| | | |
|---|---|---|
| CN | 1930666 A | 3/2007 |
| CN | 101599420 | 12/2009 |
| CN | 101798698 | 8/2010 |
| EP | 1 724 820 A1 | 11/2006 |
| JP | 2002-069698 | 3/2002 |
| JP | 2002-540011 | 11/2002 |
| JP | 2004-270014 | 9/2004 |
| KR | 10-2004-0079843 | 9/2004 |
| KR | 10-2004-0081577 | 9/2004 |
| KR | 10-2005-0068038 | 7/2005 |
| KR | 10-2008-0007931 | 1/2008 |
| TW | 544811 | 8/2003 |
| TW | 200409836 | 6/2004 |
| TW | 200410296 A | 6/2004 |
| TW | 200511422 A | 3/2005 |
| TW | I244548 | 12/2005 |
| WO | 99/41434 | 8/1999 |

(56) References Cited

FOREIGN PATENT DOCUMENTS

| WO | 03/006718 | 1/2003 |
|---|---|---|
| WO | WO 2013/148890 | 10/2013 |

OTHER PUBLICATIONS

U.S. Appl. No. 14/936,328, titled "Integrated Elastomeric Lipseal and Cup Bottom for Reducing Wafer Sticking," filed Nov. 9, 2015.
U.S. Appl. No. 15/004,593, titled "Durable Low Cure Temperature Hydrophobic Coating in Electroplating Cup Asssembly," filed Jan. 22, 2016.
U.S. Appl. No. 14/957,156, titled "Lipseals and Contact Elements for Semiconductor Electroplating Apparatuses," filed Dec. 2, 2015.
US Final Office Action, dated Nov. 26, 2013, issued in U.S. Appl. No. 13/432,767.
US Office Action, dated Nov. 6, 2014, issued in U.S. Appl. No. 13/563,619.
US Final Office Action, dated Apr. 23, 2015, issued in U.S. Appl. No. 13/563,619.
US Notice of Allowance, dated Aug. 31, 2015, issued in U.S. Appl. No. 13/563,619.
US Notice of Allowance [corrected Notice of Allowability], dated Sep. 23, 2015, issued in U.S. Appl. No. 13/563,619.
US Office Action, dated Feb. 23, 2015, issued in U.S. Appl. No. 13/584,343.
US Notice of Allowance, dated Aug. 31, 2015, issued in U.S. Appl. No. 13/584,343.
US Notice of Allowance (Supplemental Notice of Allowability) dated Mar. 11, 2011, issued in U.S. Appl. No. 11/932,595.
US Notice of Allowance (Corrected Notice of Allowability) dated Jan. 23, 2013, issued in U.S. Appl. No. 13/154,224.
US Office Action, dated Oct. 28, 2015, issued in U.S. Appl. No. 13/852,767.
US Final Office Action, dated Apr. 28, 2016, issued in U.S. Appl. No. 13/852,767.
Chinese First Office Action dated May 2, 2013, issued in CN 200910211989.X.
Korean Description of Notification of Provisional Rejection, dated May 10, 2012, issued in Application No. KR 2009-0122738.
Singapore Search and Examination Report, dated Oct. 27, 2011, issued in Application No. SG 200908245.4.
Chinese First Office Action dated Jan. 26, 2016, issued in Application No. CN 201210289735.1.
Singapore Search Report and Written Opinion, dated Oct. 6, 2014, issued in Application No. SG 201206129-7.
Singapore Final Exam Report, dated May 20, 2015, issued in Application No. SG 201206129-7.
Taiwan Office Action and Search Report, dated May 12, 2016, issued in Application No. TW 101129602.
PCT International Search Report and Written Opinion dated Jul. 25, 2013 issued in PCT/US2013/034178.
PCT International Preliminary Report on Patentability and Written Opinion dated Oct. 9, 2014 issued in PCT/US2013/034178.
Chinese First Office Action dated Mar. 2, 2016 issued in Application No. CN 201380023757.6.
*Cambridge English Dictionary*, Meaning of "against" (2016), 2 pages.
Everett, D.H. (2001) "Definition of Surface Active Agents," *Manual of Symbols and Terminology for Physicochemical Quantities and Units*, Appendix II, *International Union of Pure and Applied Chemistry, Division of Physical Chemistry*, Adopted by the IUPAC Council at Washington DC, USA on Jul. 23, 1971, 6pp.

US Office Action, dated Nov. 1, 2011, issued in U.S. Appl. No. 12/633,219.
US Notice of Allowance, dated Jan. 12, 2012, issued in U.S. Appl. No. 12/633,219.
US Notice of Allowance, dated Mar. 19, 2012, issued in U.S. Appl. No. 12/633,219.
US Office Action, dated Oct. 26, 2012, issued in U.S. Appl. No. 13/432,767.
US Office Action, dated Mar. 2, 2011, issued in U.S. Appl. No. 11/929,638.
US Notice of Allowance, dated May 23, 2011, issued in U.S. Appl. No. 11/929,638.
US Office Action, dated Jul. 7, 2010, issued in U.S. Appl. No. 11/932,595.
US Office Action, dated Nov. 17, 2010, issued in U.S. Appl. No. 11/932,595.
US Notice of Allowance, dated Jan. 26, 2011, issued in U.S. Appl. No. 11/932,595.
US Notice of Allowance, dated Mar. 8, 2011, issued in U.S. Appl. No. 11/932,595.
US Notice of Allowance, dated Mar. 18, 2011, issued in U.S. Appl. No. 11/932,595.
US Office Action, dated Nov. 4, 2011, issued in U.S. Appl. No. 13/154,224.
US Office Action, dated Mar. 16, 2012, issued in U.S. Appl. No. 13/154,224.
US Final Office Action, dated Jul. 18, 2012, issued in U.S. Appl. No. 13/154,224.
US Notice of Allowance, dated Oct. 4, 2012, issued in U.S. Appl. No. 13/154,224.
US Office Action, dated May 15, 2003, issued in U.S. Appl. No. 09/927,741.
US Office Action, dated Oct. 7, 2003, issued in U.S. Appl. No. 09/927,741.
US Office Action, dated Feb. 26, 2004, issued in U.S. Appl. No. 09/927,741.
US Notice of Allowance, dated Jun. 1, 2004, issued in U.S. Appl. No. 09/927,741.
US Office Action, dated Oct. 8, 2003, issued in U.S. Appl. No. 10/010,954.
US Notice of Allowance, dated Feb. 26, 2004, issued in U.S. Appl. No. 10/010,954.
US Notice of Allowance, dated Oct. 27, 2005, issued in U.S. Appl. No. 10/309,414.
US Office Action, dated May 21, 2012, issued in U.S. Appl. No. 13/079,745.
US Office Action, dated Sep. 21, 2012, issued in U.S. Appl. No. 13/079,745.
US Notice of Allowance, dated Nov. 19, 2012, issued in U.S. Appl. No. 13/079,745.
Singapore Written Opinion, dated Mar. 9, 2011, issued in Application No. 200908245.4.
Japanese Office Action, dated Oct. 2, 2012, issued in Application No. 2009-278998.
KR Notification of Decision to Grant, dated Nov. 4, 2012, issued in Application No. 2009-0122738.
Shin-Etsu Polymer Co., Ltd., "L-type connector," http://www.shinpoly.co.jp./business/connector/products_e/1/html?typezeb (one page) downloaded May 23, 2003.
Shin-Etsu Polymer Co., Ltd., "SS-type connector," http://www.shinpoly.co.jp./business/connector/products_e/ss.html?typezeb (2 pages) downloaded May 23, 2003.
TW International Search Report, dated Jun. 11, 2012, issued in Application No. 098142112.

* cited by examiner

CLEANING ELECTROPLATING SUBSTRATE HOLDERS USING REVERSE CURRENT DEPLATING

CROSS REFERENCE TO RELATED APPLICATION

This application claims benefit of U.S. Provisional Patent Application Ser. No. 61/618,337, titled "CLEANING ELECTROPLATING SUBSTRATE HOLDERS USING REVERSE CURRENT DEPLATING," and filed on Mar. 30, 2012, which is incorporated by reference herein in its entirety.

BACKGROUND

Recent advances in semiconductor fabrication and processing has led to increased use of electroplating to deposit a variety of materials on semiconductor devices. Such materials include electroplated copper, nickel, and tin-silver alloys. Electroplating tin-silver alloys oftentimes leads to spurious metal buildup around the lip seal and cup regions of a substrate holder assembly (sometimes implemented as a clamshell assembly). This buildup, referred to as "lip seal plating" and/or "cup bottom plating," depending on its location, may in some circumstances cause the seal formed between the substrate and lip seal to fail, resulting in contamination of inner portions of the clamshell assembly with potentially corrosive electroplating solution.

SUMMARY

Certain embodiments herein relate to methods and apparatus for removing unintended metallic deposits from electroplating apparatuses using reverse current deplating techniques.

In one aspect of the embodiments herein, a method of mitigating an electroplating deposit on a substrate holder configured to hold a wafer substrate in an electroplating cell is provided. The method may include providing a deplating disk in the substrate holder when the electroplating cell is not being used for electroplating metal on a substrate, such that the deplating disk makes electrical contact with a plurality of electrical contacts in the substrate holder, immersing the deplating disk and substrate holder into an electroplating solution within the electroplating cell, and applying an anodic potential to the deplating disk under conditions sufficient to remove, at least partially, the electroplating deposit from the substrate holder, where the deplating disk has a size and a shape matching those of a standard semiconductor wafer.

In certain embodiments, the deplating disk has metal or other non-corrosive conductive material at least around its perimeter in a region for making electrical contact with the plurality of electrical contacts in the substrate holder. The peripheral metal may be a noble metal, and in some cases includes platinum, palladium, gold, iridium, osmium, ruthenium, or a combination thereof. In certain embodiments, the peripheral metal may include titanium, tantalum, or chromium. The deplating disk may also include an insulator in a central region of the deplating disk. In other cases, the metal located on the periphery of the deplating disk also extends over the entire deplating face of the deplating disk. In some implementations, the deplating disk has a diameter of about 450 mm, while in other implementations the deplating disk may have a diameter of about 300 mm.

The electroplating deposit to be removed may be an alloy in certain cases. In one example, the electroplating deposit to be removed includes silver and tin. The substrate holder may also include a lip seal in various implementations. The method of mitigating the electroplating deposit may also include compressing the deplating disk on the lip seal to cause the deplating disk to come into electrical contact with the electroplating deposit. In some embodiments, after applying the anodic potential to the deplating disk, the compression on the deplating disk is varied to cause the lip seal to flex to a new position and thereby cause the deplating disk to come into electrical contact with the electroplating deposit, and a further anodic potential is applied to the deplating disk under conditions sufficient to remove the electroplating deposit from the substrate holder. In certain implementations, the method also includes moving the deplating disk to a storage area for the deplating disk, where the storage area is separate from a storage area for semiconductor wafers.

In another aspect of the embodiments herein, a method of cleaning a semiconductor plating apparatus is provided, the method including providing a deplating disk in a wafer holder assembly, where the deplating disk includes corrosion-resistant conductive material around at least the periphery of the deplating disk, and where the wafer holder assembly includes a peripheral lip seal and a plurality of electrical contacts, where the wafer holder assembly is positioned in an electroplating cell, and where the wafer holder assembly has metal deposited thereon, and sealing the deplating disk in the wafer holder assembly by applying a force to the deplating disk to thereby deform the lip seal and provide a liquid-tight seal, and thereby establish electrical communication between the plurality of electrical contacts and the metal deposited on the wafer holder assembly, submerging the deplating disk in cleaning solution in the electroplating cell, and applying cathodic current to an anode in the electroplating cell and applying anodic current to the deplating disk to thereby remove metal deposited on the wafer holder assembly.

In practicing this embodiment, the force applied to the deplating disk may be the same as the force applied to a plating wafer when a plating wafer is sealed in the wafer holder assembly. Conversely, the force applied to the deplating disk may be different (less force or more force) as compared to a force applied to a plating wafer when a plating wafer is sealed in the wafer holder assembly. The deplating disk may include an insulated center portion, in certain cases.

Often but not always, the metal deposited on the wafer holder assembly is an alloy. In certain embodiments, the metals that form the alloy may have reduction potentials that differ by about 0.1 V or more, and in some cases by about 0.3 V or more. In a particular case, the alloy may include tin and silver. The operation of applying anodic current to the deplating disk may be carried out in various ways. In one case, the current is applied in a galvanostatic mode, while in another case the current is applied in a potentiostatic mode. Where the potentiostatic mode is used, the anodic current may be applied to the deplating disk until a target current density is reached. Where the galvanostatic mode is used, the anodic current may be applied until a target potential is reached. The target potential may be a potential at or slightly beyond the oxidation potential of a component metal in the metal deposited on the wafer holder assembly. Further, when practicing the galvanostatic mode, the current density may be between about 0.5-2 Amps per square decimeter. In a particular example, applying anodic current to the deplating disk includes applying current at a first voltage potential and applying current at a second voltage potential, where the first and second voltage potentials correspond to potential that are slightly beyond the voltage potentials of each of two metals in the alloy. While applying anodic current to the depleting disk, the current density may be controlled to avoid oxygen generation. In one case, the anodic current may be applied to the depleting disk in pulses.

In some embodiments, the cleaning solution is the same as a solution used for electroplating a wafer. In a particular example, the cleaning solution includes between about 0.2-1.5 g/L silver ions, between about 30-100 g/L tin ions, and between about 70-350 g/L acid.

The method may also include rotating the depleting disk at 5 RPM or greater during at least the applying current operation. Further, the method may include rotating the depleting disk in a first direction and then in a second direction. In some embodiments, the depleting disk may be removed from the cleaning solution, then spun between about 100-600 RPM to reclaim the cleaning solution from the depleting disk, then rinsed with deionized water, and then spun to remove the deionized water. This procedure helps conserve cleaning solution and preserve the depleting disk. In some cases, the depleting disk may be automatically moved to a depleting disk storage area after cleaning.

In certain implementations, the method may be implemented such that it is repeated periodically. In one example, the method repeats after a time interval. In another example, the method is repeated after a certain number of plating wafers are plated. In a third example, the method is repeated after a certain amount of charge has passed. In a fourth example, the method is repeated after a signal is received, where the signal corresponds to a condition where the wafer holder assembly has a threshold amount of metal deposited thereon. This last example may be especially useful where there is some detection mechanism in place to detect when cleaning is appropriate.

In certain embodiments, applying current to the depleting disk may dissolve metal deposited on the wafer holder assembly that is within about 10 mm of the depleting disk-lip seal interface. Alternatively or in addition, applying current to the depleting disk may dissolve at least about 25% of the metal plated on the wafer holder assembly.

In another aspect of the embodiments disclosed herein, a plating tool for plating semiconductor wafers is provided, including at least one plating module including an electroplating cell configured to contain a metal-ion-containing electroplating solution; a plating cell wafer holder assembly including a peripheral lip seal and a plurality of electrical contacts, where the plating cell wafer holder assembly is configured to receive a semiconductor wafer, and the peripheral lip seal is configured to form a liquid-tight seal between an edge of the semiconductor wafer and the peripheral lip seal to thereby prevent electroplating solution from coming into contact with the plurality of electrical contacts; a depleting disk including a corrosion resistant conductive material (in some cases a noble metal) around at least the periphery of the depleting disk, where the noble metal of the depleting disk is positioned to be in electrical communication with the plurality of electrical contacts and in close proximity to the peripheral lip seal such that when anodic current is applied to the cleaning disk during a cleaning mode, metallic deposits formed on the lip seal and plating cell wafer holder assembly are removed; and a power supply configured to provide anodic current to an anode and cathodic current to a semiconductor substrate in a plating mode, and cathodic current to the anode and anodic current to the depleting disk in the cleaning mode.

The plating tool may also include a wafer storage area configured to store the semiconductor wafers when they are not being electroplated in the plating module. The power supply may be configured, in certain instances, to supply current according to the plating mode when the semiconductor substrate is present in the plating module, and to supply current according to the cleaning mode when the depleting disk is present in the plating module. The plating tool may also include an auxiliary electrode capable of being in electronic communication with the semiconductor wafer when at least a portion of the semiconductor wafer is immersed in the electroplating solution.

The depleting disk may include one or more exposed thermodynamically-oxidizable but kinetically passivated corrosion-resistant metals. As an example, in certain implementations, the kinetically passivated corrosion resistant metal includes at least one of the non-noble materials titanium, tantalum, vanadium, tungsten, niobium and/or chromium. Further, the corrosion resistant conductive material on the depleting disk may include a "noble" material selected from the group consisting of platinum, palladium, gold, iridium, osmium, ruthenium, rhodium, and combinations thereof. These noble metals are generally not passivated, but rather are corrosion resistant due to their thermodynamic nature (e.g., high oxidation potentials). In certain implementations, the corrosion resistant conductive material of the depleting disk has an oxygen formation overvoltage below about 0.5 V. In some embodiments, the depleting disk includes an insulated center portion surrounded by a peripheral conductive portion. The width of the conductive portion, in certain cases, is between about 1-10 millimeters, or between about 2-6 millimeters. The peripheral conductive portion may help define a gap between the center insulated portion of the depleting disk and the lip seal of the plating tool. In some implementations, this gap is between about 1-5 millimeters. In some embodiments, the depleting disk may include a semiconductor substrate that is at least partially coated with a corrosion resistant conductive material. Typically, the depleting disk will have a depleting face and an opposite face. In certain implementations, the depleting face includes a step extending away from the opposite face of the depleting disk. The step may be at least 1 mm long, and be positioned between about 0.1 and 5 mm inward from the perimeter of the depleting disk. A gap between the step and lip seal may be about 2 millimeters or less. In some embodiments, the step physically contacts the lip seal when engaged.

In an additional aspect of the embodiments herein, a plating tool for plating semiconductor wafers is provided, including at least one plating module including an electroplating cell configured to contain a metal-ion-containing electroplating solution; a plating cell wafer holder assembly including a peripheral lip seal and a plurality of electrical contacts, where the plating cell wafer holder assembly is configured to receive a workpiece that is either a semiconductor wafer or a depleting disk, where the peripheral lip seal is configured to form a liquid-tight seal between an edge of the workpiece and the peripheral lip seal to thereby prevent electroplating solution from coming into contact with the plurality of electrical contacts; a power supply configured to provide anodic current to an anode and cathodic current to the workpiece in a plating mode, and cathodic current to the anode and anodic current to the workpiece in a cleaning mode; a depleting-disk storage holder; a wafer storage area; a robotic arm; and a controller configured to direct the robotic arm to move the deplating disk between the deplating disk storage holder and the plating module, and to move the semiconductor wafer between the wafer storage area and the plating module, and to direct the power supply to supply current according to the plating mode when the semiconductor wafer is present in the plating module, and to supply current according to the cleaning mode when the deplating disk is present in the plating module.

The plating tool may also include at least one workpiece rinsing module, and/or an auxiliary electrode capable of being in electronic communication with the work piece when at least a portion of the workpiece is immersed in the electroplating solution. Further, the lip seal and/or plating cell wafer holder assembly may have a metallic alloy deposited thereon. The metals which form the alloy may have reduction potentials that differ by over about 0.1 V, and in some cases by over about 0.3 V. In certain examples the alloy includes tin, and in one particular example the alloy includes tin and silver. The plating tool may also include a cone that sits atop the workpiece. Separately or in addition, the plating tool may include a force applicator that applies a variable force to the workpiece, either directly or indirectly. In many cases the lip seal is compressible. This compressibility allows the lip seal to deform, thereby providing additional electrical connections to metallic deposits.

In another aspect of the embodiments herein, a deplating disk is provided. The deplating disk serves as an anode when used to mitigate an electroplating deposit on a substrate holder that is configured to hold a substrate in an electroplating cell while applying a cathodic current to electroplate metal on the substrate. The deplating disk may include a perimeter region including a corrosion-resistant conductive material positioned for making electrical contact with a plurality of electrical contacts in the substrate holder, and an interior region including an insulator, where the deplating disk is shaped as a circular wafer having a diameter or about 300 or about 450 mm. In certain implementations, the deplating disk has a different diameter corresponding to the diameter of a substrate that is plated in the plating tool in which the deplating disk is used. While typical substrates are 300 or 450 mm, any size deplating disk may be used, so long as it is close in diameter to the type of substrate that is plated in the particular apparatus. Often times, the corrosion resistant conductive material is metal. In certain implementations the metal may be a noble metal.

These and other features will be described below with reference to the associated drawings.

DETAILED DESCRIPTION

Figures 1A, 1B, 1C, 1D:
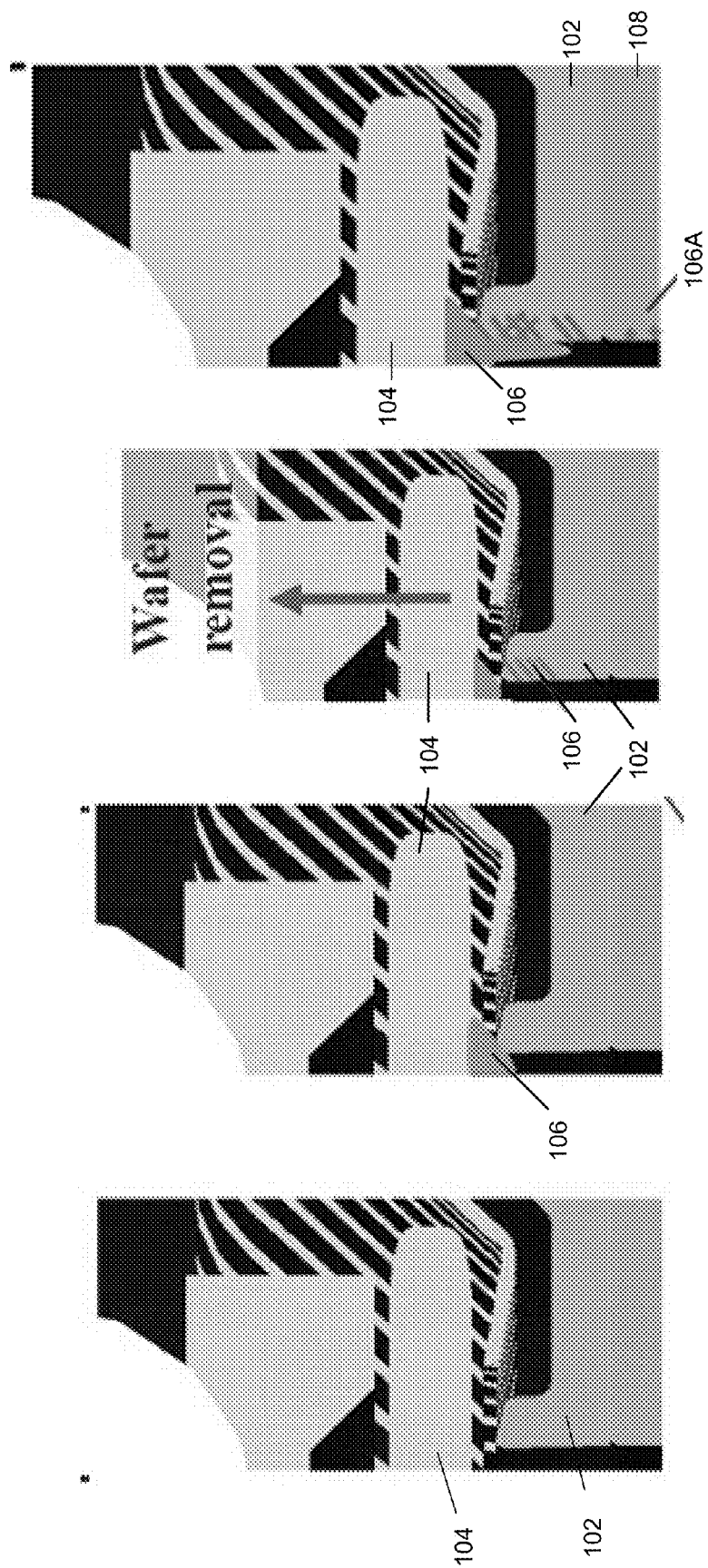
FIG. 1A shows a wafer resting on a lip seal in a plating apparatus, with no unwanted metal deposits present.
FIG. 1B-1D show a wafer resting on a lip seal in a plating apparatus with an unwanted metal deposit present.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the terms "electrolyte," "plating bath," "bath," and "plating solution" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Integrated Circuit Fabrication, Electroplating Process and Contamination Sources Electrochemical deposition may be employed at various points in the integrated circuit fabrication and packaging processes. At the integrated circuit (IC) chip level, damascene features are created by electrodepositing copper within vias and trenches to form multiple interconnected metallization layers. Above the multiple metallization layers, the packaging of the chip occurs. Various wafer level packaging (WLP) structures may be employed, some of which may contain alloys or other combinations of two or more metals or other components. For example, the packaging may include one or more bumps made from solder or related materials. A typical example of a plated bump starts with a conductive substrate seed layer (e.g. a copper seed layer) having an under bump diffusion layer of plated nickel (e.g., between about 1-2 micrometers thick and 100 micrometers wide) under a layer containing lead tin solder plated pillars (e.g., 50 to 100 micrometers thick and 100 micrometers wide). After plating, photoresist stripping, and etching of the conductive substrate copper seed layer, the pillar of solder is carefully melted or reflowed to create a solder bump or ball attached to the under bump metal.

In another scheme, which may be referred to as a copper pillar and micro pillar scheme, an under bump of a non-solder plated pillar metal such as copper, nickel, or a combination of these two, is created below a solder film. In this scheme, the solder film is typically much thinner and smaller than in the scheme above. In the copper pillar and micro pillar approaches, it is beneficial to have tight/precise control of feature pitch and separation. The copper pillars may be, for example, about 50 microns or less in width, while the features are separated from one another by only about 75-100 micrometers center to center. The copper structures may be about 20-40 micrometers in height. On top of the copper pillar, a nickel barrier film, e.g., about 1-2 micrometers thick, may be used to separate the copper from the tin-containing solder and, thereby, to avoid a solid state reaction to form various mechanically and chemically undesirable bronzes. Finally, a solder layer, typically 20-40 micrometers in thickness is added. This scheme also enables a reduced amount of solder for the same features size, leading to a lower cost and a lower total amount of lead (in lead-containing solders) in the chip.

Recently, a move away from lead-containing solders has increased in momentum due to environmental and health-safety concerns. Tin-silver solder alloy bumps are of particular interest. Lead-tin materials provide good quality "bumps" for packaging and are very easy to plate. However, due to the high toxicity of lead, lead-containing solders are being used less frequently. For example, the RoHS initiative (Directive 2002/95/EC of The European Parliament) requires entities to change from the established tin-lead process to a lead free process. Replacement bump materials may include indium, tin, tin-silver binary materials, tin-bismuth binary materials, and tin-silver-copper ternary materials. Without going into too many details, pure tin can suffer from a number of fundamental limitations and application difficulties, such as the tendency to form large single grained balls with varying crystal orientations and thermal expansion coefficients, and "tin whiskers" which can lead to interconnect-to-interconnect shorting. The binary and ternary materials generally perform better and alleviate some of these pure tin issues, at least in part by precipitating a large number of small grain inclusions of the non-tin component as part of the solder melt-to-solid state freezing process. Included in such compositions are silver-tin alloys.

Deposition of silver-tin alloys is accomplished by a process that frequently employs an inert anode (rather than the potentially more desirable "active" or soluble anode). Part of the difficulty in using an active anode for this and similar systems results from the very widely separated electrochemical deposition potentials of silver and tin; the standard electrochemical potentials (Eos) of the metals are separated by more than 0.9 volts ($Ag^+/Ag$: 0.8V NHE, $Sn^{+2}/Sn$: −0.15V). Because elemental silver is substantially more noble and inert than elemental tin, the silver will undergo a displacement reaction and electroplate out of solution onto the surface of a tin anode or tin/silver anode. This chemical "short circuit" removes (strips or extracts) the relatively low concentration of silver from the plating solution continuously, resulting in both an uncontrollable process as well as the formation of reduced silver metal on the tin anode.

Methods and apparatus for efficient and high-quality plating when using potential-differing set of metals are described in the following U.S. patent applications: U.S. Provisional Patent Application No. 61/502,590, filed Jun. 29, 2011, entitled "ELECTRODEPOSITION WITH ISOLATED CATHODE AND REGENERATED ELECTROLYTE"; U.S. Provisional Patent Application No. 61/418, 781, filed Dec. 1, 2010, entitled, "ELECTROPLATING APPARATUS AND PROCESS FOR WAFER LEVEL PACKAGING"; and U.S. patent application Ser. No. 13/172,642, filed Jun. 29, 2011, entitled, "CONTROL OF ELECTROLYTE HYDRODYNAMICS FOR EFFICIENT MASS TRANSFER DURING ELECTROPLATING." Each of these applications is incorporated by reference herein in its entirety.

Despite the existence of high quality plating regimes when plating two or more metals, where there is a large difference in the plating potentials, there remains the issue of unwanted metal plating on surfaces of the electroplating cup and how to address these unintended deposits. Although the discussion herein is couched in terms of tin-silver plating, it applies equally to any unwanted deposits.

Described herein are methods and apparatus for automated cleaning of substrate handling apparatus, particularly apparatus that hold a semiconductor substrate and rotate the wafer during plating or other semiconductor fabrication process. This processing often leaves unwanted deposits on the substrate handling components, such as electroplating cups, which may be also referred to as clamshells because of their constructions. As used herein, the term electroplating deposit refers to material which has been electroplated onto a surface. This material is typically metal, and in many cases it is a metallic alloy. In practicing the embodiments herein, the electroplating deposit is typically found on a surface of an electroplating apparatus. Particularly problematic from the contamination perspective is the area about the circumference of the substrate, e.g., where the substrate is sealed by a lip seal of the electroplating cup.

While the discussion herein focuses on substrate holders constructed with a cup and lip seal, other arrangements may be used. As used herein, the term substrate holder refers to any part of an electroplating apparatus which supports a substrate during plating. A substrate holder generally has some portion that is exposed to electrolyte during electroplating. The terms substrate holder, wafer holder, work piece holder, electroplating cup, plating cup, cup, clamshell holder, and clamshell are used interchangeably. A variety of wafer holders can be used in practicing the embodiments herein. The term lip seal generally refers to a portion of the wafer holder that engages with the edge of the wafer and creates a seal that protects the interior of the wafer holder (including the electrical contacts for connecting to the wafer) from electroplating solution while exposing the entire plating face of the wafer to electroplating solution. Any of a variety of lip seal designs may be used. In certain cases the lip seal is not part of the wafer holder itself, but instead contacts the wafer holder when engaged. The lip seal is often made from an elastomeric material.

For simplicity and clarity, most of the examples herein concern wafer-face-down, "fountain" plating apparatuses. In such apparatuses, the work piece to be plated (typically a semiconductor wafer or other substrate) generally has a substantially horizontal orientation (which may in some cases vary by a few degrees from true horizontal for some part of, or during the entire immersion and/or plating process) and may be powered to rotate during plating, yielding a generally vertically upward electrolyte convection pattern. Integration of the impinging flow mass from the center to the edge of the wafer, as well as the inherent higher angular velocity of a rotating wafer at its edge relative to its center creates a radially increasing sheering flow pattern (parallel to the face of the wafer). Clamshell-type electroplating apparatuses having a cup and cone arrangement are frequently used to hold wafers in place before and during electroplating. Examples of clamshell and fountain plating cells/apparatuses are included in the Sabre® family of Electroplating Systems produced by and available from Lam Research, Inc. of Fremont, Calif. Additionally, clamshell fountain electroplating systems are described in, e.g., U.S. Pat. No. 6,800,187 filed Aug. 10, 2001 and U.S. Pat. No. 8,308,931 filed Feb. 11, 2010, which are incorporated herein by reference in their entireties. While the description herein focuses primarily on an orientation with the wafer and the holder face down, parallel to the plane of the local earth's surface, it is understood that other orientations, such as angled or normal to the earth surface are not excluded and are also envisioned.

Electroplating of various alloys may cause unintended deposition of one or more materials forming these alloys on surfaces of substrate holding apparatuses, such as electroplating cups. FIG. 1A shows a close-up cross-sectional view of part of a wafer holder assembly holding a wafer 104. The wafer 104 engages with lip seal 102 during plating, the lip seal operating to provide a fluid-tight seal to prevent plating fluid from flowing past this boundary. In FIG. 1A there are no unwanted metal deposits on the lip seal 102. In FIG. 1B, an unwanted metal deposit 106 is present. One root of the presence of the unwanted metal deposit is the difference in electrochemical potentials of materials forming the metal alloy. Some examples of electroplated alloys that have substantial differences in electrochemical reductions potentials include tin-silver, tin-bismuth, tin-copper, tin-silver-copper, tin-indium, lead-indium, nickel-palladium, indium-nickel, nickel-tin and iron-cobalt. Often, this unintended deposition initiates at an interface between the substrate and apparatus or, more specifically, at an interface between the substrate and lip seal. In some cases the deposit may grow, progressing along the entire surface(s) of the substrate holder, e.g., an electroplating cup/clamshell.

Without being restricted to any particular theory, a proposed deposition mechanism will now be explained with reference to electroplating of tin-silver alloys. FIG. 1B illustrates tin-silver deposition 106 formed on a working (front) surface of the substrate physically contacting a lip seal. This deposition may be caused by a localized absence of photoresist due to photoresist edge defects, substrate misalignment, and other causes. Furthermore, a tin-silver layer may be thicker than the photoresist layer and, as a result, may cause "bump-out" plating.

Some of these tin-silver deposits may break loose from the substrate and remain connected to the lip seal or some other component of the electroplating cup. This may cause some residual and discontinuous tin-silver deposits to be retained in the lip seal area during wafer (substrate) removal, as shown in FIG. 1C. These deposits can later become potential active nuclei for deposition.

During multiple electroplating cycles, some of these nuclei may become connected and form a semi-continuous conductive surface. When this surface contacts a portion of the substrate being plated, the conductive surface also receives some plating material and may work effectively as a seed layer. The initially discontinuous nuclei, which may primarily include tin, can undergo a displacement reaction with silver ions in the electrolyte (two atoms of silver are deposited for every one atom of tin consumed), thus yielding a large net volume change. The reaction promotes the volumetric growth of these nuclei, often causing the nuclei to physically connect over time. This reaction is believed to cause a net volume change of about 40%.

Without being limited to a particular theory, it is believed that spurious deposition of tin-silver alloy occurs as a result, at least in part, of the significantly differing reduction potentials of atomic tin versus atomic silver, and furthermore, that growth of spurious deposits occurs via a displacement reaction ($Sn+2Ag^+ \rightarrow Sn^{2+}+2Ag$) on the surface of the lip seal and cup surfaces resulting in a substitution of 2 silver atoms (having oxidation state +1) for every atom of tin (having oxidation state +2). Once again, without being limited to a particular theory, it is believed that other metal or alloy deposits formed from metals having significantly different reduction potentials (e.g., where the difference in reduction potentials is greater than 0.1 V, or greater than 0.3 V) may lead to the same or similar problems involving spurious metallic deposition on the lip seal and cup of an electroplating assembly.

Overall, the initially discontinuous nuclei turn into a significant plating surface, as shown in FIG. 1D. Some nuclei may also form on other parts of the cup 108, such as below the lip seal on a protrusion of the cup 108 that supports the lip seal. These on-cup deposits are shown in FIG. 1D as element 106A. Likewise, deposits initially formed on the lip seal may extend into other areas. Other types of deposits and deposition mechanisms may occur and have been observed, such as forming silver and/or tin metal containing heterogeneous colloids.

Figure 2:
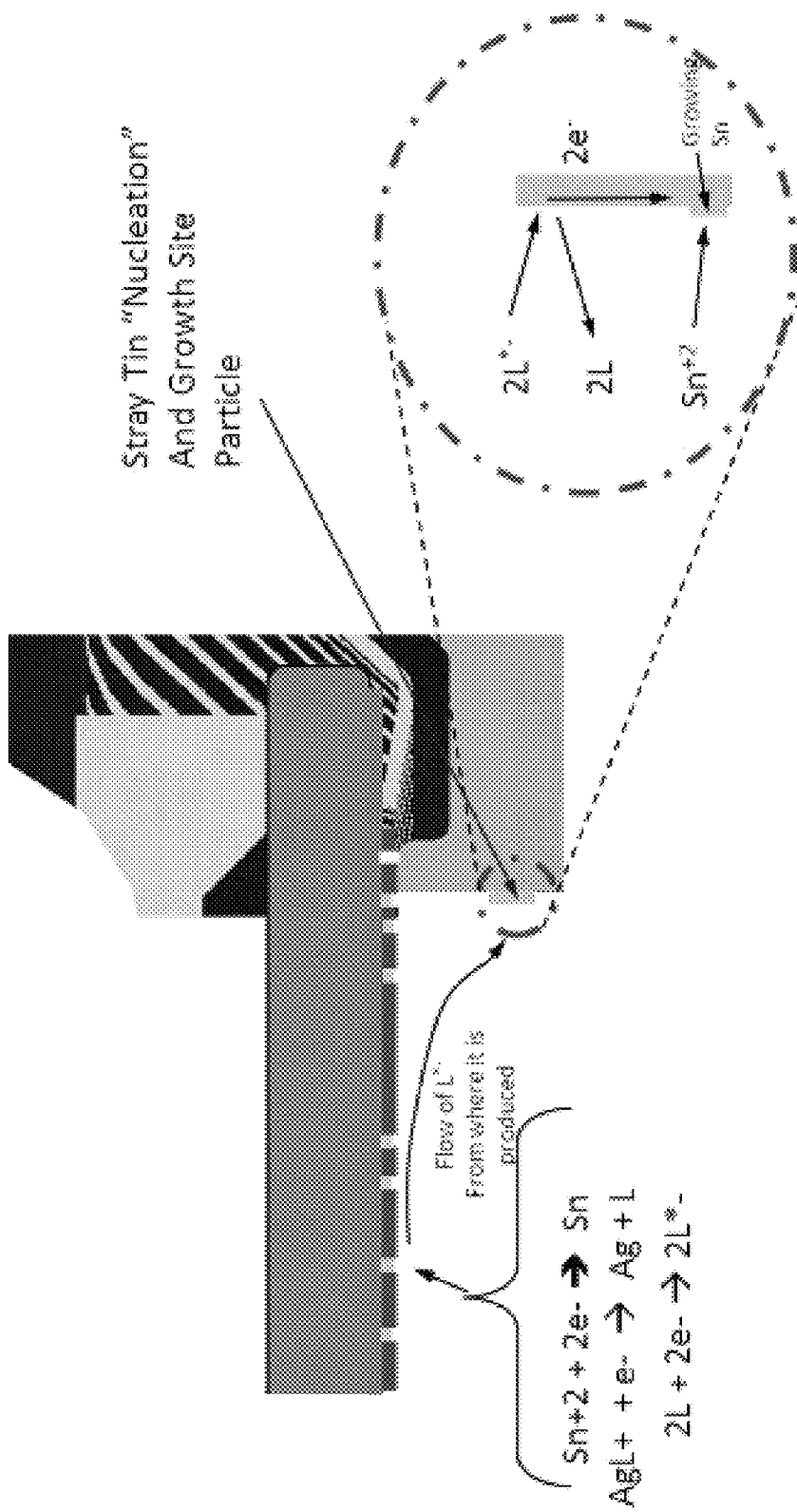
FIG. 2 shows a proposed mechanism for the deposition of tin-silver material on portions of a plating apparatus.

Oftentimes, unintended deposition can be found away from the wafer-lip seal interface. This evidence points to a process where some edge material, rather than being plated and remaining on the substrate, is electrochemically removed from the substrate and plated on the cup holding apparatus. Without being restricted to any particular theory, it is believed that a deposition rate of this unintended build-up on the lip seal and side walls of the electroplating cup is not linear. This specific deposition rate usually increases towards the later stages of the overall electroplating process. A proposed mechanism of tin-silver redistribution is illustrated in FIG. 2. In particular, in one proposal, it is purported that the reaction $2L+2e^- \rightarrow 2L^{*-}$ may occur on the wafer itself during the plating of silver on bumps and the like, thereby creating a reduced form of the silver ligand (complexing agent) L. It is further proposed that the reduced ligand is free to flow and act as a reducing agent to react at a nearby surface, and heterogeneously produce two electrons according to the reaction $2L^{*-} \rightarrow 2L+2e^-$, which then react with tin ions to form solid tin on the wafer holder apparatus, according to the reaction $Sn^{2+}+2e^- \rightarrow Sn$.

It is also believed that this unintended deposition essentially acts as a "cathode current thief." The deposition redirects the current distribution in the electroplating cup, in particular near the interface between the lip seal and substrate, leading to degradation of plating near the substrate edges. The unwanted deposition may also cause non-uniformity in deposition thicknesses and alloy compositions. Once the unintended deposition has a substantial coverage, the thieving current becomes large enough to cause severe degradation and defects in packaging and WLP applications. As such, this unintended deposition may stochastically transition from being relatively insignificant to causing catastrophic failures, usually in a sudden manner. Examples of this catastrophic failure are further illustrated in U.S. Provisional Patent Application Ser. No. 61/618,337, titled "CLEANING ELECTROPLATING SUBSTRATE HOLDERS USING REVERSE CURRENT DEPLATING," and filed on Mar. 30, 2012, which was previously incorporated by reference herein in its entirety.

Because tin-silver alloys (and other like alloys) are often deposited toward the end of semiconductor manufacturing processes (for example, as tin-silver solder contacts), the wafers used in these processes are typically very expensive, having been through many processing operations before they reach this point in the overall production process. Therefore, the loss or low yield of these wafers due to non-uniformities caused by the buildup of metal depositions on the lip seal can be especially costly.

The undesirable deposition needs to be periodically removed to avoid catastrophic failures. One way of removing this deposition is to perform physical (e.g., manual) wipe downs using a nitric acid solution. When depositions are substantial, some components of an electroplating apparatus may need to be removed and replaced. Often, these preventive operations need to be performed on a daily basis and are challenging in production environments with high volumes and multiple tools.

Problems associated with spurious metal deposits on lip seals and other plating apparatus parts are exacerbated as wafers are designed with more and more features near the edge of wafers, where they are likely to be impacted by such plating. Further, the presence of near edge features promotes generation of spurious deposits on wafer holders and seals. The interference between near-edge features and the lip seal plating is much greater when the density of features near the edge is high. The drive towards more near-edge features results from a desire to maximize the number of semiconductor devices that can be obtained from a single wafer.

While the discussion and examples herein generally focus on the removal of tin/silver buildup, the embodiments may be practiced to remove other types of plated metals, as well. The mechanism for the tin/silver build up process is described in some detail above and elsewhere. The embodiments herein may also be practiced to address the buildup of copper on a plating cup used to deposit copper, such copper deposits being formed by the transition of partially reduced cupric ions to cuprous ions, or by the formation of organic-additive reducing species at the wafer surface which are swept to the wafer edge, lip seal and cup bottom region.

Wafer Surface:$Cu^{+2}+e^-$(wafer surface)$\rightarrow Cu^{+1}$, then

Lip seal/Cup Bottom:$2Cu^{+1}\rightarrow Cu+Cu^{+2}$ or

Wafer Surface:$A+e- \rightarrow A^-$(formation of reductive additive)

Lip seal/Cup Bottom:$Cu^{+2}+2A- \rightarrow Cu+2A$

The embodiments herein use a wafer-shaped cleaning disk (i.e., depleting disk) made of a chemically inert but conductive medium. As used herein, the terms cleaning disk and depleting disk refer to a disk that is placed into a substrate holder during a cleaning operation, in the space where a wafer would be placed during plating, and which receives an anodic current during the cleaning operation. A cleaning disk is typically the same shape and size as a normal plating wafer (i.e., the physical dimensions of the cleaning disk are each within about 5%, or within about 1%, of the dimensions of a plating wafer).

During cleaning, the cleaning disk is placed in the plating apparatus in the space where a wafer is placed during plating, i.e., in the wafer holder/cup/clamshell. A reverse current (reverse relative to the current applied during a conventional plating process) is applied to dissolve the unwanted metal deposits. Further details of the methods and apparatus for performing the methods are discussed in the relevant sections below.

Methods

Provided are cleaning methods and systems to remove unintended metallic deposits from electroplating apparatuses using reverse current deplating techniques. An electroplating cup may have deposits formed on at least the lip seal that need to be removed during cleaning Deposits may be also present on other surfaces of the electroplating cup. The methods herein may be used to remove deposits from the lip seal-wafer interface and other surfaces of the electroplating cup. The removal may involve depleting unintended deposits from one area and, in certain embodiments, may involve partial re-plating of these deposits in other areas, depending on polarization of the solution.

Figure 3:
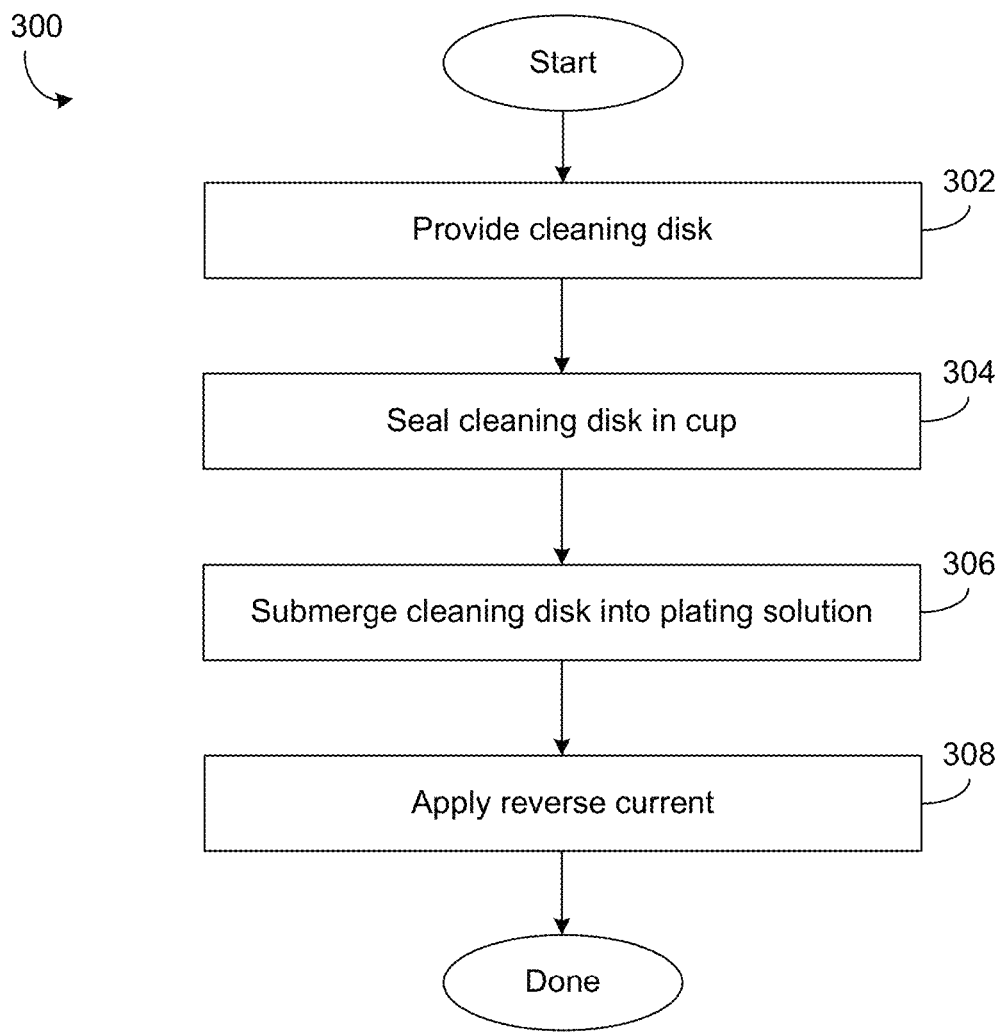
FIG. 3 is a flowchart for a method of cleaning an electroplating apparatus according to a disclosed embodiment.

FIG. 3 illustrates a flowchart of a method according to an embodiment disclosed herein. The method 300 of cleaning an electroplating cup to remove unintended deposits formed on at least a lip seal of the electroplating cup involves providing a cleaning disk (also referred to as a deplating disk) into the electroplating cup at block 302. The cleaning disk may have a front surface including a corrosion resistant conductive material (e.g., platinum, palladium, gold, iridium, osmium ruthenium, and combinations thereof). The cleaning disk is generally the same size as processed substrates. In certain cases, the cleaning disk is formed from a substrate by depositing a layer of corrosion resistant conductive material on one or more of its surfaces, thus allowing a conventional silicon wafer to be converted into a cleaning disk.

Next, the cleaning disk is sealed in the electroplating cup by compressing the lip seal of the electroplating cup against the front surface of the cleaning disk at block 304. During sealing, an edge portion of the front surface establishes electrical contact with the contact fingers of the electroplating cup. Also during the sealing operation, an exposed portion of the front surface establishes electrical contact with the deposits formed on at least the lip seal. In some implementations, the cleaning disk is sealed in substantially the same way as a regular substrate. For example, the level of force used and the extent of lip seal deformation achieved may be the same (e.g., within about 5%) during sealing of a cleaning disk as during sealing of a plating wafer. In other embodiments, the sealing may involve applying different forces to the cleaning disk as compared to when a regular substrate is sealed. This difference in forces may be used to achieve different deformation of the lip seal during cleaning and to achieve contact between unintended deposits and the conductive surface of the cleaning disk. In certain embodiments, the force applied to the cleaning disk may change during the cleaning method while the cleaning disk remains sealed in the electroplating cup. Such changes in force may be used to change the deformation of the lip seal and contact levels to ensure more thorough cleaning.

The method then proceeds at block 306 with submerging the exposed portion of the front surface of the cleaning disk into an electroplating solution and applying a reverse current to the front surface of the cleaning disk at block 308 using the contact fingers of the electroplating cup to electrochemically dissolve the deposits in the plating solution. Generally, at the later stages of the removal process, as the amount of metal remaining on the lip seal and cup bottom decreases, the potential of the disk increases, and oxygen evolution eventually starts to occur. By monitoring the progression of the voltage vs. time (galvanostatic), or decrease in current vs. time (potentiostatic operations) one can generally detect the completion of the removal process.

The cleaning method involves positioning a cleaning (depleting) disk in an electroplating cup similar to a regular processed substrate. The front surface of the cleaning disk includes a corrosion resistant conductive material to form electronic connections to deposits on the cup's surfaces. As used herein, corrosion resistant material means a material that is resistant to dissolution into the plating electrolyte at any applied potential. For example, the cleaning disk may be a wafer-shaped disk made from titanium, tantalum, and/or chromium. These materials, though thermodynamically unstable with respect to water and oxygen, will form a surface layer that is electronically and chemically resistive (e.g., a passivated oxide or the like), and therefore do not substantially corrode spontaneously or when anodically polarized. Instead, when an anodic current is passed, rather than metallic corrosion, oxygen evolution will generally be the preferred electrolytic process on the corrosion-resistant surface, as long as a sufficiently large oxidation potential is applied.

Further, the cleaning disk may be a silicon or other substrate that is coated with a noble metal such as platinum, palladium, gold, iridium, osmium, and/or ruthenium. As used herein, noble metals are metals of the group VIIIB, period 5 and 6 elements, or alloys formed from these elements, which are resistant to corrosion and oxidation in moist air and are substantially free of a chemically and electronically resistive passivating film. The applied potential for use of a noble metal is generally less than for a passivated metal. The passivated or noble metal layer may only be present or exposed at the disk edges, and may be electrically masked everywhere else, such as in the center portion of the disk. Coatings with low oxygen formation overvoltage (e.g., 0.4V), such as coatings including noble metals, are preferred from an energy and power consumption prospective.

The disk is sealed in the cup and submerged into a plating solution. During the sealing operation, an edge portion of the front surface establishes an electrical contact with contact fingers of the electroplating cup. The contact fingers are provided on a sealed side of the lip seal. Establishing contact between the front surface of the cleaning disk and the contact fingers may be similar to establishing contact between a regular substrate and the contact fingers. Sealing compression in the cup may change during cleaning to cause different deformation of the lip seal and to form new electrical connections to the deposits.

In certain embodiments, the method may involve changing a force applied to the cleaning disk to seal the cleaning disk against the lip seal. This change in force may be performed while applying the reverse current to the cleaning disk. The force is changed to achieve different deformation of the lip seal. For example, the force may be increased to achieve greater deformation of the lip seal and establish additional electrical contacts between the deposits and the exposed portion of the front surface of the cleaning disk.

Figure 4:
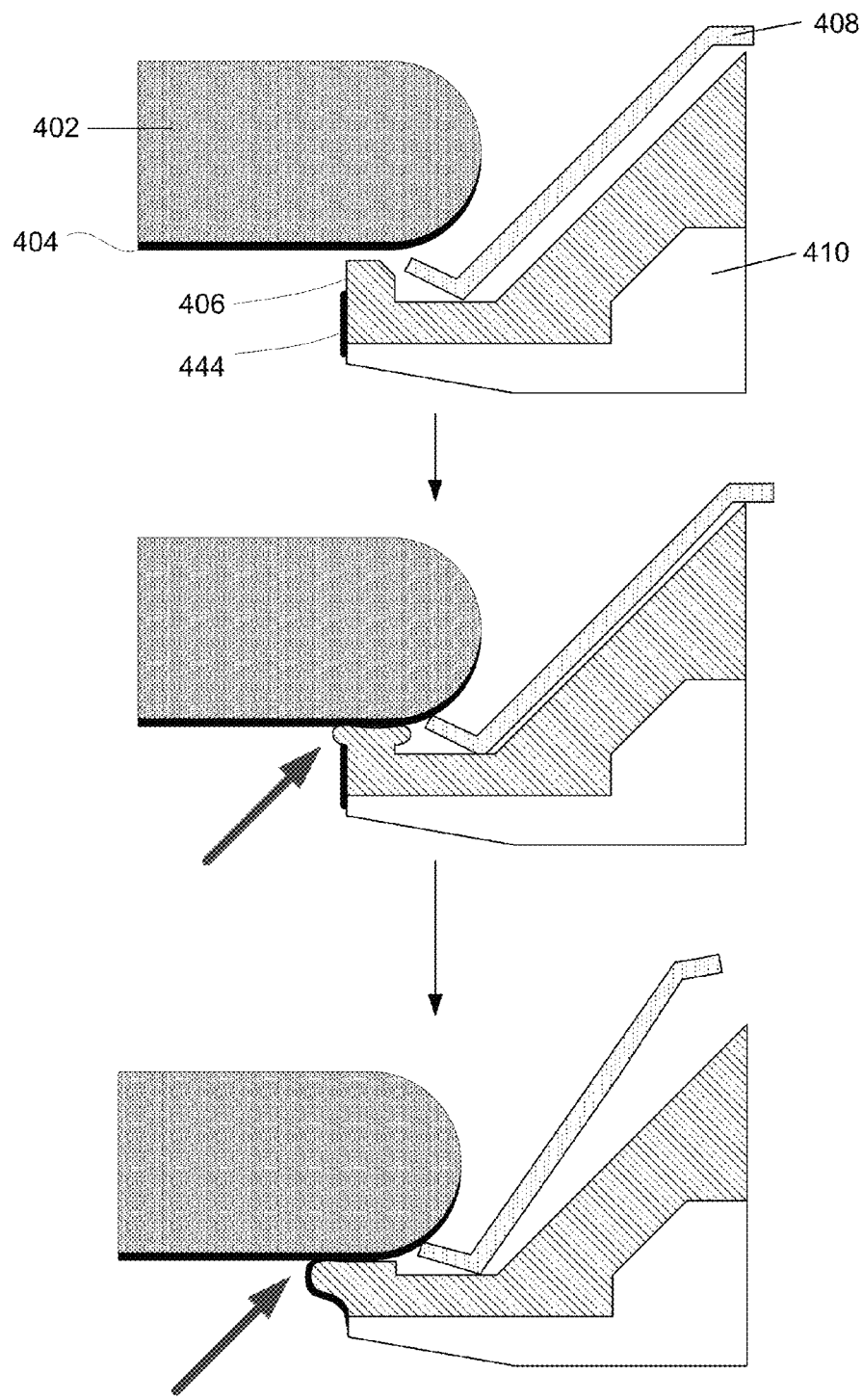
FIG. 4 illustrates the cleaning disk/lip seal interface as greater amounts of downward force are applied to the cleaning disk.

FIG. 4 illustrates how different levels of force may be applied during sealing/deplating to establish electrical contact between the cleaning disk and unwanted deposits. The cleaning disk 402 coated with corrosion-resistant conductive layer 404 is positioned on top of the lip seal 406 and the electrical contacts 408 (only one electrical contact is shown in FIG. 4). The lip seal 406 is supported by the cup 410. An unwanted metal deposit 444 is present on the lip seal, but it is removed from the wafer-lip seal interface by some distance. It is not unusual for some deposits to remain unconnected after sealing. However, it is desirable for the conductive layer 404 on the cleaning disk 402 to come into direct contact with the unwanted deposit 444, in order to provide an electrical connection and help dissolve the deposit 444. In order to establish this contact, a downward force is applied to the wafer (represented by the downward arrows). This force is transmitted through the wafer to the lip seal, which deforms in response to the applied force. This deformation can be seen in the middle and bottom panels of FIG. 4. As different levels of force are used, the lip seal deforms and the cleaning disk establishes electrical contact with unwanted deposit clusters at various locations that may not have been previously in contact with the front side of the cleaning disk. When a relatively substantial force is applied, the cleaning disk 402 may press down upon and thereby move the electrical contacts 408. As such, the electrical contacts should be flexible enough to withstand this movement.

Once the cleaning disk is sealed in the electroplating cup, the process may proceed with submerging the exposed portion of the front surface of the cleaning disk into an electroplating solution. The electroplating solution may be the same as a solution used for plating regular substrates. In specific embodiments related to tin-silver plating, an electroplating solution used for cleaning may include 0.2 to 2 g/l of silver ions, 30 to 120 g/l tin ions, and 70-350 or more g/l acid (based on sulfuric acid or methane sulfonic acid). The solution may also include organic additives, such as grain refiners, noble metal complexers, brighteners, accelerators, suppressors, and/or levelers. Examples of suitable grain refiners include but are not limited to PEG, hydroxylated cellulose, gelatin, and peptone. Accelerators, suppressors, brighteners, and levelers are organic bath additives capable of selectively enhancing or suppressing rates of deposition of metal on different surfaces of the wafer features, thereby improving the uniformity of deposition. Complexing agents suitable for complexing silver include aromatic thiols or sulfide compounds including thiophenol, mercaptophenol, thiocresol, nitrothiophenol, thiosalicylic acid, aminothiophenol, benzenedithiophenol, mercaptopyridine. 4,4-thiodiphenol, 4,4-aminodiphenyl sulfide, thiobisthiophenol, 2,2-diaminodiphenyl disulfide, 2,2-dithiodibenzoic acid, ditolyl disulfide and 2,2-dipyridyl disulfide. These complexing agents may be used as silver complexers at low pH (e.g., pH less than about 2) and are suitable for use in tin-silver plating baths (e.g., baths containing methanesulfonic acid).

The cleaning method may proceed with applying a reverse current through the front surface of the cleaning disk to electrochemically dissolve the deposits in the plating solution. During this reverse current stage, the cleaning disk serves as an anode (a positive potential is applied to it), and any unintended deposits at the lip seal that are electronically connected with the disk also act as an anode.

The reverse current may be applied in either a potentiostatic mode or in a galvanostatic mode, in certain cases. In other cases, a combination of these two modes is used. In some embodiments, the current density is controlled to avoid oxygen generation as explained herein. The reverse current may be applied for a predetermined period of time or until a threshold is reached (e.g., until a certain current density is reached in potentiostatic mode, or until a target potential is reached in galvanostatic mode). The reference electrode may be used to control some of these process parameters. The time for applying the reverse current may depend on the rate and charge passed on product wafers. It may also depend on cleaning frequency. In certain embodiments, applying the reverse current is performed in two stages, each stage being performed at a different voltage potential relative to the other stage as explained herein. The first voltage will generally be lower, and correspond to the metal in the alloy having a lower voltage potential (for example tin), while the second voltage will generally correspond to the other metal (e.g., silver, the metal having a higher, more positive voltage). In certain embodiments, applying the reverse current is performed in a pulsed mode.

When appropriate anodic voltages are applied to the deplating disk and metallic deposits, a corrosion potential can be established and a corrosion current can be passed directly (though contact between the disk metal and unwanted lip seal metal) and indirectly (via an ionic reaction couple though the ionic solution) to the metallic deposits at the substrate-to-lip seal interface. The metal deposits will start oxidizing and dissolving into electrolytic ions ($Sn^{2+}$, $Ag^+$, $M^+$ where M=metal), thereby removing the unintended deposits on the lip seal and cup bottom. The process may be performed either at a fixed applied anodic potential (e.g. fixed vs. a reference electrode or vs. the counter electrode) or using a constant current. In a particular embodiment, initially a constant current is applied, until reaching a critical switch-over potential, after which the process is performed in a potentiostatic mode. The applied currents, constant voltage value and the potential for the switchover may be established after considering and balancing the efficacy of removing the metals, and in inhibiting the process by creating significant amounts of gas (oxygen), which may block the process from occurring. In certain implementations of this embodiment, the critical switch-over potential is effectively slightly beyond the tin oxidation potential (as used herein, "slightly beyond" means above and within about 0.1-0.4 V of the cited potential, though in some cases the voltage may be more than 0.4 V beyond the cited potential).

Without being restricted to any particular theory, it is believed that, in certain embodiments, a direct electrical connection between the conductive portion of the cleaning disk and unintended deposits on the electroplating cup is not always needed, and indirect corrosion current may be sufficient to remove some, particularly smaller, deposits. For example, oxygen formation (with our without gas evolution) may occur at the cleaning disk acting as an anode. At the same time, hydrogen evolution may occur at the counter electrode of the cell as well as metal deposition. This process creates a voltage gradient in the electrolyte, including the electrolyte adjacent to deposits that may remain unconnected. At sufficiently high fields, portions of the deposits that are farthest away from the cleaning disk will acquire a negative charge and plate tin as well, while deposits closest to the disk will be positively charged and corrode metal(s) of these deposits. The net result will be movement of the deposits away from the disk and consequentially away from the substrate-to-lip seal interface. The presence of unintended deposits at this interface is particularly problematic as they can easily make electrical connections to the substrate during later plating cycles. At the same time, deposits away from this interface are less problematic and may remain relatively inert for significant periods of time. Therefore, even if metals contained in the unintended deposits are not actually removed from the electroplating cup surfaces but are merely moved away from the substrate-to-lip seal interface, the necessary cleaning is effectively achieved.

In certain embodiments, the electroplating cup is rotated within the electroplating solution during application of the reverse current. The rotation speed of the electroplating cup may be at least about 5 RPM, at least about 30 RPM, at least about 50 RPM, and in some cases is up to about 180 RPM. In certain embodiments, the electroplating cup is rotated in two opposite directions within the electroplating solution during application of the reverse current (i.e., the cleaning disk may be first rotated in one direction and then in an opposite direction).

After application of the reverse current is completed and the cleaning disk is removed from the plating solution, the disk may be spun to reclaim the electrolyte off its surface before the seal is broken. The rotation speed during this operation may be between about 100 RPM and 600 RPM. Sometimes this operation is referred to as spin drying. The cleaning disk may be then rinsed with DI water while being rotated at sufficiently high speed to remove the remaining electrolyte on the wafer surface followed by another spin drying cycle. The cleaning disk is then removed from the electroplating cup and moved to the spin rinse drying (SRD) module of the plating apparatus described below. In the SRD module, the cleaning disk may be rinsed with water to remove any remaining trapped electrolyte, followed by a high speed dry. Afterwards, the cleaning disk is extracted by the front end robot and returned dry to the dummy wafer storage area for reuse in another cleaning operation. With proper selection of materials and operating conditions during the cleaning process, the cleaning disk should not be subjected to removal or deposition of any materials on its surfaces. The cleaning disk may be continuously reused.

In certain embodiments, the cleaning process may be performed in multiple stages, e.g., a first stage configured to dissolve one metal from the alloy deposits and another stage configured to dissolve another metal of this alloy. For example, a voltage during the first stage may be controlled such that this stage is completed at a voltage that is slightly beyond the tin oxidation potential as described above. This stage may be followed by another stage performed at a higher anodic voltage to oxidize silver. In other embodiments, a process may be performed in a galvanostatic regime, whereby the appropriate effective current density is between about 0.05 to 2 Amps per Square Decimeter.

Figure 5A:
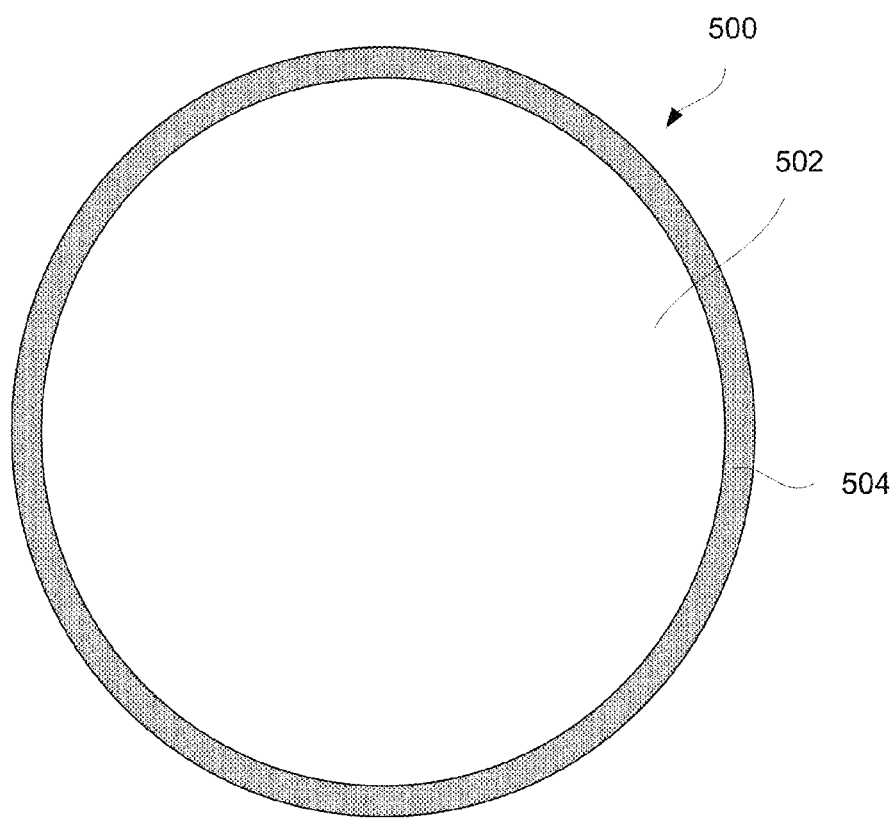
FIGS. 5A and 5B show top-down and side views of a cleaning disk, respectively.
Figure 5B:
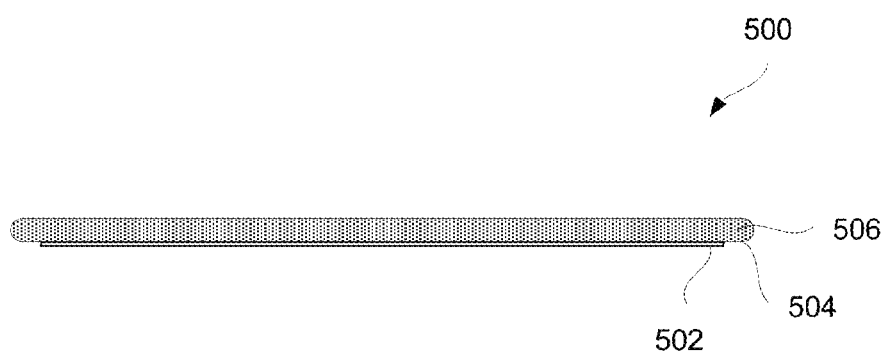

A cleaning disk typically has a front surface having a corrosion resistant conductive material. This front surface is also referred to as the deplating face. Some examples of the corrosion resistant materials include noble corrosion resistant and conductive materials such as platinum, palladium, gold, iridium, osmium, ruthenium, rhodium, and osmium, and chemically passivated materials such as titanium, tantalum, chromium, vanadium, tungsten, and niobium. The conductive material does not need to extend over the entire front surface of the cleaning disk. In certain embodiments, a center portion of the front side of the cleaning disk is covered by an insulating material, such as polyvinyl chloride (PVC). In certain cases, the cleaning disk may include an insulated center portion that is surrounded by a conductive layer, the conductive layer forming a ring around the insulated center portion and extending at least to an edge of the body. The cleaning disk itself may have the same diameter as a standard electroplating wafer. FIGS. 5A and 5B illustrate front and side views, respectively, of cleaning disk 500 in accordance with certain embodiments. The insulated portion 502 is shown with a white circle, while the conductive portion 504 is shown with a grayed ring. In certain embodiments, the width of conductive portion 504 is between about 1 millimeter and 10 millimeters or, more specifically, between about 2 millimeters and 6 millimeters. This width may define, at least in part, a gap between the insulated center portion and lip seal after sealing the cleaning disk in the electroplating cup. In certain embodiments, this gap is between about 1 millimeter and 5 millimeters. The conductive portion 504 may be provided as a layer on otherwise insulated body 506. One example of the insulated body is a silicon wafer. In other embodiments, the entire body 506 is conductive and may itself form the conductive surface.

Figure 6:
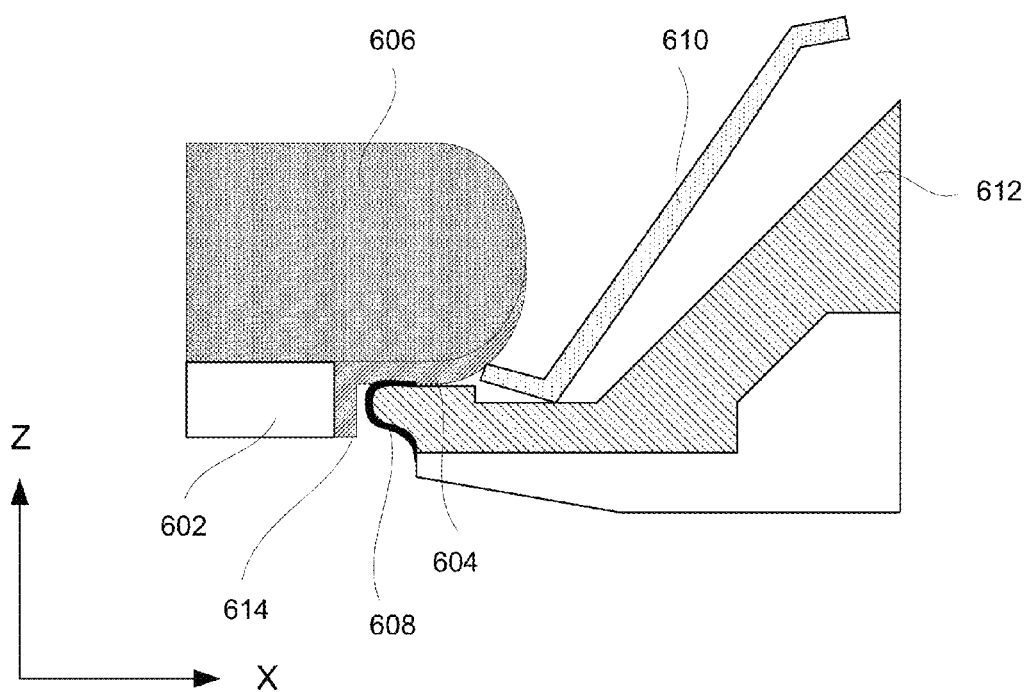
FIG. 6 shows an embodiment of a cleaning disk having a step and engaging with the lip seal.

In certain embodiments, the front surface of the cleaning disk includes a conductive step extending perpendicular to the front surface. FIG. 6 illustrates step 614 extending downward (in the direction opposite of the positive Z direction) from body 606. Step 614 may be formed by extending a conductive portion 604 over the insulated portion 602 as shown, or by specially conforming the shape of conductive portion 604. In certain embodiments, step 614 and conductive portion 604 are separate components that may come in contact during sealing of the cleaning disk in the electroplating cup.

The height of the step (in the Z direction) may be at least about 1 millimeter or, more specifically, at least about 2 millimeters. Having a conductive element extending along the Z axis allows making electrical connections with additional deposits to be removed during the cleaning operation. As shown in FIG. 6, deposits 608 may follow the shape of lip seal 612. A large portion of these deposits 608 may extend down onto the vertical surface (at least prior to deformation of lip seal 612 by the cleaning disk). Extending a conductive element in this direction allows establishing more connections between deposits 608 and this element. Step 614 may contact a portion of lip seal 612 after sealing the cleaning disk in the electroplating cup. In other embodiments, there may some gap between step 614 and lip seal 612 even after sealing the cleaning disk as shown in FIG. 6. For example, the step may be positioned within 2 millimeters of the lip seal after sealing the cleaning disk. Even with a gap, step 614 may provide sufficient current density within the electrolyte in order to electrochemically dissolve deposits on the other side of this gap due to polarization of the electrolyte as explained above. In certain embodiments, the lip seal deforms and extends towards the step when the cleaning disk is sealed in the electroplating cup.

Even if after performing a cleaning process, some deposits remain on the electroplating cup, these deposits remain away from the substrate-to-lip seal interface (e.g., at least 2 mm away from this interface, and in some cases at least 5 mm or 10 mm away from this interface). Furthermore, substantial amounts of initial deposits are expected to be actually removed (e.g., at least 25% of the deposits are removed, for example at least 50% of the deposits are removed, by mass). Overall, disruptive characteristics of initial unintended deposits will be significantly diminished and plating operations may be continued without risk of catastrophic failures.

This cleaning process may be applied after pre-determined periodic substrate-processing intervals, analogous to maintenance cycles. The process may repeat after a certain number of wafers are processed, after a certain amount of time has passed, after a certain amount of charge has passed, etc. In some cases, where a detection method is used to detect the presence of plated metal on the lip seal or other part of the wafer holder assembly, the detector may send a signal that cleaning is appropriate. In these cases, cleaning may be repeated whenever such a "cleaning required" signal is received. The frequency of cleaning depends on many factors, such as wafer open area, bath composition, and temperature as well as other operating conditions. Preventive maintenance that involves physical wiping of the electroplating cup surfaces with acidic solution can be performed less frequently when combined with the proposed cleaning processes. Furthermore, the proposed cleaning processes can be implemented with very few modifications to existing plating apparatuses and without introducing any modifications to plating solutions or risk of contamination to the plating solution.

Processes for cleaning wafer plating assemblies are further described in U.S. patent application Ser. No. 13/563, 619, titled "AUTOMATED CLEANING OF WAFER PLATING ASSEMBLY," filed on Jul. 31, 2012, which is incorporated herein by reference in its entirety.

Apparatus

The methods described herein may be performed by any suitable apparatus. A suitable apparatus includes hardware for accomplishing the process operations and a system controller having instructions for controlling process operations in accordance with the present invention. In some embodiments, the hardware may include one or more process stations included in a process tool.

Figure 7:
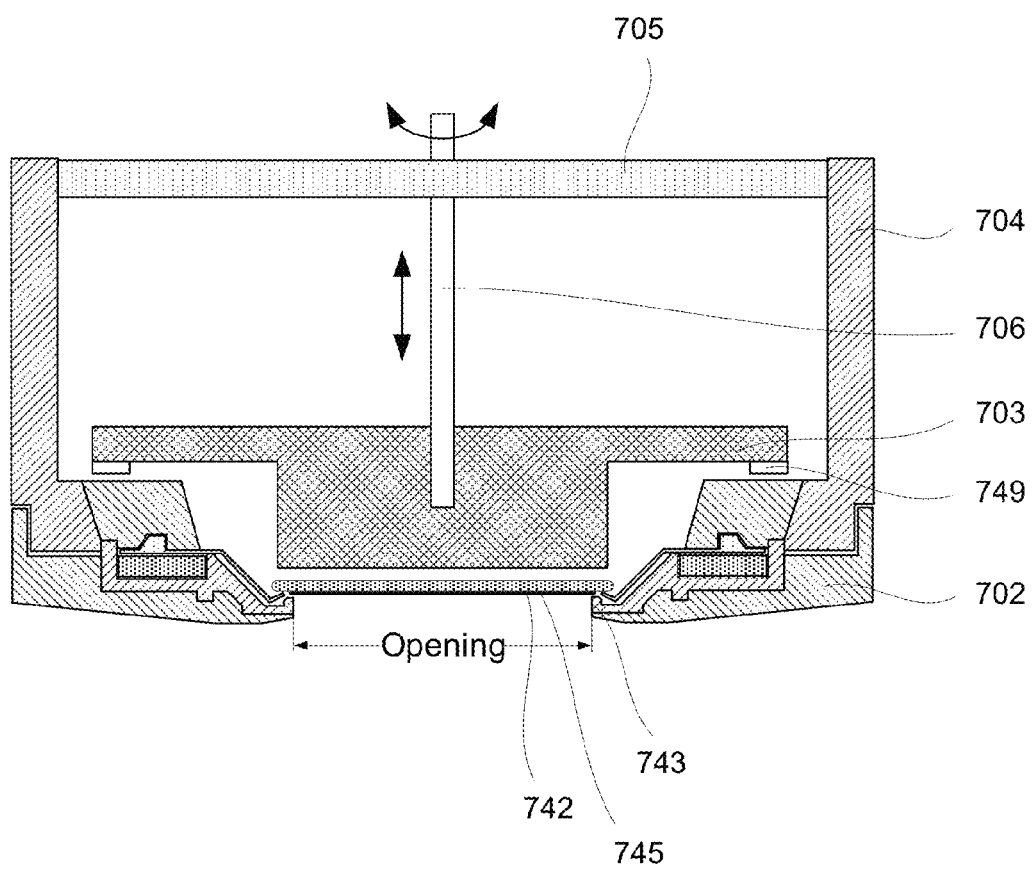
FIG. 7 shows a cross-sectional schematic of an electroplating cell according to a disclosed embodiment.

FIG. 7 provides details on the cup and cone assembly of the clamshell according to an embodiment herein. The figures is cross-sectional schematic representation of a portion 701 of assembly 700 including cone 703 and cup 702. This figure is not meant to be an accurate depiction of the cup and cone assembly, but rather a stylized depiction for discussion purposes. Cup 702 is supported by top plate 705 using struts 704. Generally, cup 702 provides a support upon which substrate 745 rests. Cup 702 includes an opening through which electrolyte from a plating cell can contact substrate 745 provided at the opening. Note that substrate 745 has a front/working side 742, which is where plating occurs. The periphery of substrate 745 rests on a bottom inward protrusion of cup 702 (e.g., "knife-shaped" edge) or more specifically on lip seal 743 positioned on the bottom inward protrusion of cup 702. Cone 703 presses down on the back side of substrate 745 to hold it in place and to seal it with lip seal 743 during submersion of the electroplating cup into the plating solution and during actual plating.

During the cleaning process describe herein, substrate 745 is replaced with a cleaning disk, which is positioned and sealed with the electroplating cup in a similar manner. As such, any discussion of substrate 745 in relation to FIG. 7 applies equally well to the cleaning disk when a cleaning method is being performed (with the exception of the current applied, which is reversed during the cleaning process as compared to a conventional plating process). The cleaning disk has a portion of its front surface made from a corrosion resistant conductive material. This conductive portion contacts unintended deposits on the cup as the cleaning disk is sealed in the cup. The electroplating cup containing and sealing the cleaning disk is then submerged into the electrolyte in a manner similar to the regular plating process. However, instead of applying a direct current to the conductive portion of the cleaning disk which would have caused deposition of metals on this surface, the reverse current is applied causing cleaning and deplating of the unintended residues from the electroplating cup surfaces.

Returning to the FIG. 7, loading of wafer 745 into 701 is performed by lifting cone 703 from its depicted position via spindle 706. When cone 703 is lifted, a gap is created between cup 702 and cone 703 into which substrate 745 can be inserted. Cone 703 is then lowered to engage substrate 745 against the periphery of cup 702 as depicted or, more specifically, against lip seal 743 supported by a bottom inward protrusion of cup 702.

Spindle 706 may be used to transmit a vertical force for engaging cone 703 to substrate 745 and to rotate the entire assembly 701 during electroplating, drying, and other operations. These transmitted forces are indicated by the up/down arrow in FIG. 7 and the downwards arrows in FIG. 4. Note that substrate plating typically occurs while the substrate is being rotated with the plating solution. As explained above, assembly 701 may include a compressible lip seal 743 to form a fluid-tight seal when cone 703 engages substrate 745. The vertical force from cone 703, which is transferred through substrate 745 compresses lip seal 743 to form the fluid tight seal. Lip seal 743 prevents electrolyte from contacting the backside of wafer 745 (where the electrolyte could introduce contaminating metal atoms directly onto/ into the silicon substrate) and from reaching sensitive components of apparatus 701, such as contact fingers that establish electrical connections to the edge portions of substrate 745. This electrical connection is used to supply current to conductive portions of substrate 745 that are exposed to the electrolyte. Overall, lip seal 743 separates unexposed edge portions of substrate 745 from exposed portions of substrate 745. Both portions include conductive surfaces that are in electrical communication with each other.

Cone 703 also includes seal 749. As shown, cone seal 749 is located near the edge of cone 703 and an upper region of the cup when engaged. This arrangement also protects the backside of wafer 745 from any electrolyte that might enter the clamshell from above the cup. Seal 749 may be affixed to the cone or the cup, and may be a single seal or a multi-component seal. Upon initiation of plating, wafer 745 is introduced to assembly 702 when cone 703 is raised above cup 702. When the wafer is initially introduced into cup 702, typically by a robot arm, its front side 742 rests lightly on lip seal 743. During plating, the assembly 701 rotates in order to aid in achieving uniform plating.

Figure 8:
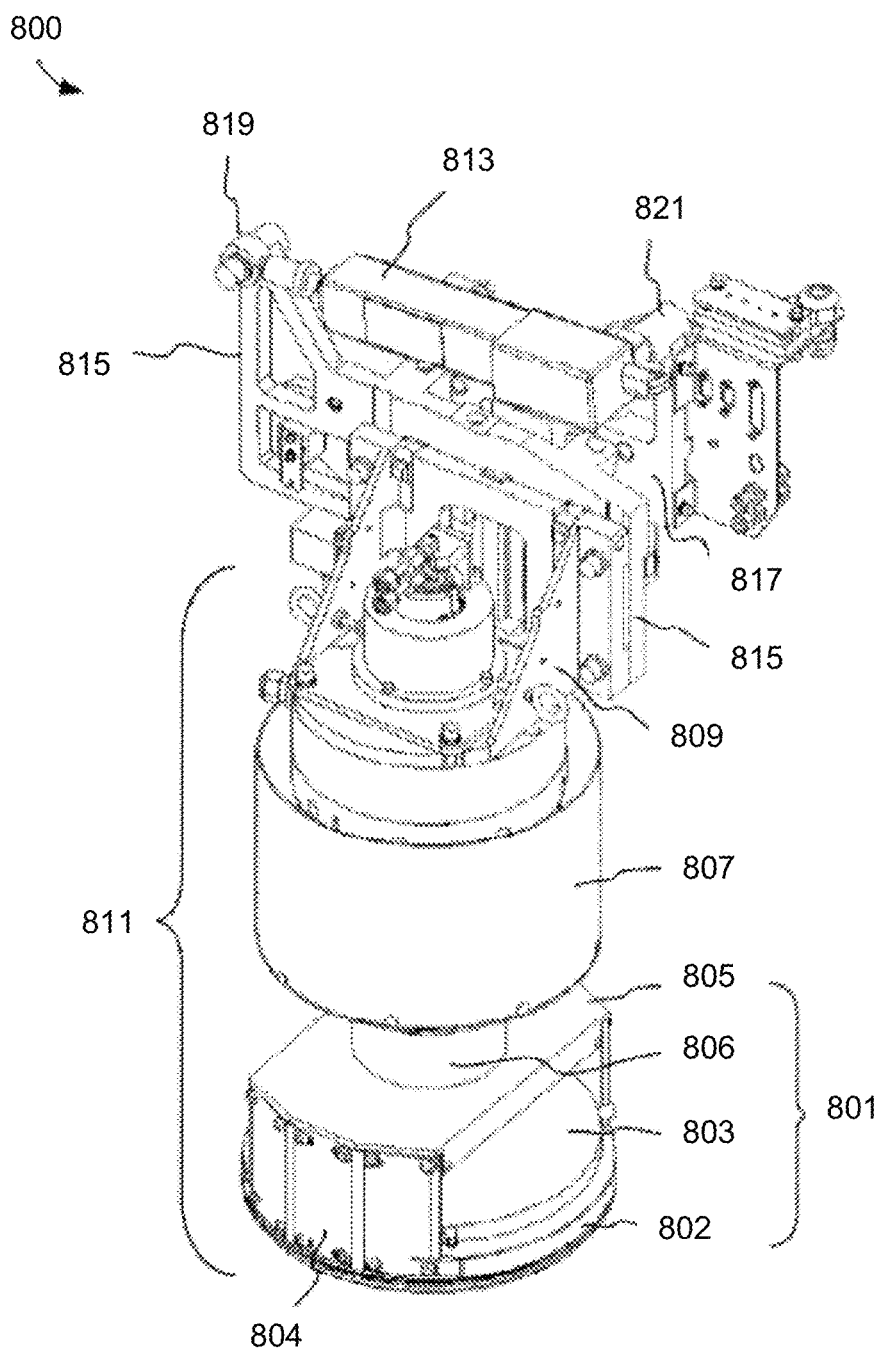
FIG. 8 demonstrates an electroplating apparatus that may be used in accordance with the embodiments herein.

FIG. 8 provides a perspective view of a wafer holding and positioning apparatus 800 for electrochemically treating semiconductor wafers. Apparatus 800 includes wafer engaging components, which are sometimes referred to herein as "clamshell" components. The actual clamshell includes cup 802 and cone 803 that clamps a wafer securely in cup 802. Cup 802 is supported by struts 804, which are connected to top plate 805. This assembly (802-805), collectively assembly 801, is driven by a motor 807, via a spindle 806. Motor 807 is attached to a mounting bracket 809. Spindle 806 transmits torque to a wafer (not shown in this figure) to allow rotation during plating. An air cylinder (not shown) within spindle 806 also provides vertical force to clamp the wafer between the cup and cone 803. For the purposes of this discussion, the assembly including components 802-809 is collectively referred to as a wafer holder 811. Note however, that the concept of a "wafer holder" extends generally to various combinations and sub-combinations of components that engage a wafer and allow its movement and positioning.

A tilting assembly, which includes first plate 815 slidably connected to second plate 817, is connected to mounting bracket 809. Drive cylinder 813 is connected both to plate 815 and plate 817 at pivot joints 819 and 821, respectively. Thus, drive cylinder 813 provides force for sliding plate 815 (and thus wafer holder 811) across plate 817. The distal end of wafer holder 811 (i.e., mounting bracket 809) is moved along an arced path (not shown) which defines the contact region between plates 815 and 817, and thus the proximal end of wafer holder 811 (i.e., cup and cone assembly) is tilted upon a virtual pivot. This allows for angled entry of a wafer into a plating bath.

The entire apparatus 800 is lifted vertically either up or down to immerse the proximal end of wafer holder 811 into a plating solution via another actuator (not shown). Thus, a two component positioning mechanism provides both vertical movement along a trajectory perpendicular to an electrolyte and a tilting movement allowing deviation from a horizontal orientation (parallel to electrolyte surface) for the wafer (angled-wafer immersion capability).

Note that apparatus 800 is typically used with a particular plating cell having a plating chamber which houses an anode and electrolyte. The plating cell may also include plumbing or plumbing connections for circulating electrolyte through the plating cell—and against the work piece being plated. It may also include membranes or other separators designed to maintain different electrolyte chemistries in an anode compartment and a cathode compartment.

Figure 9:
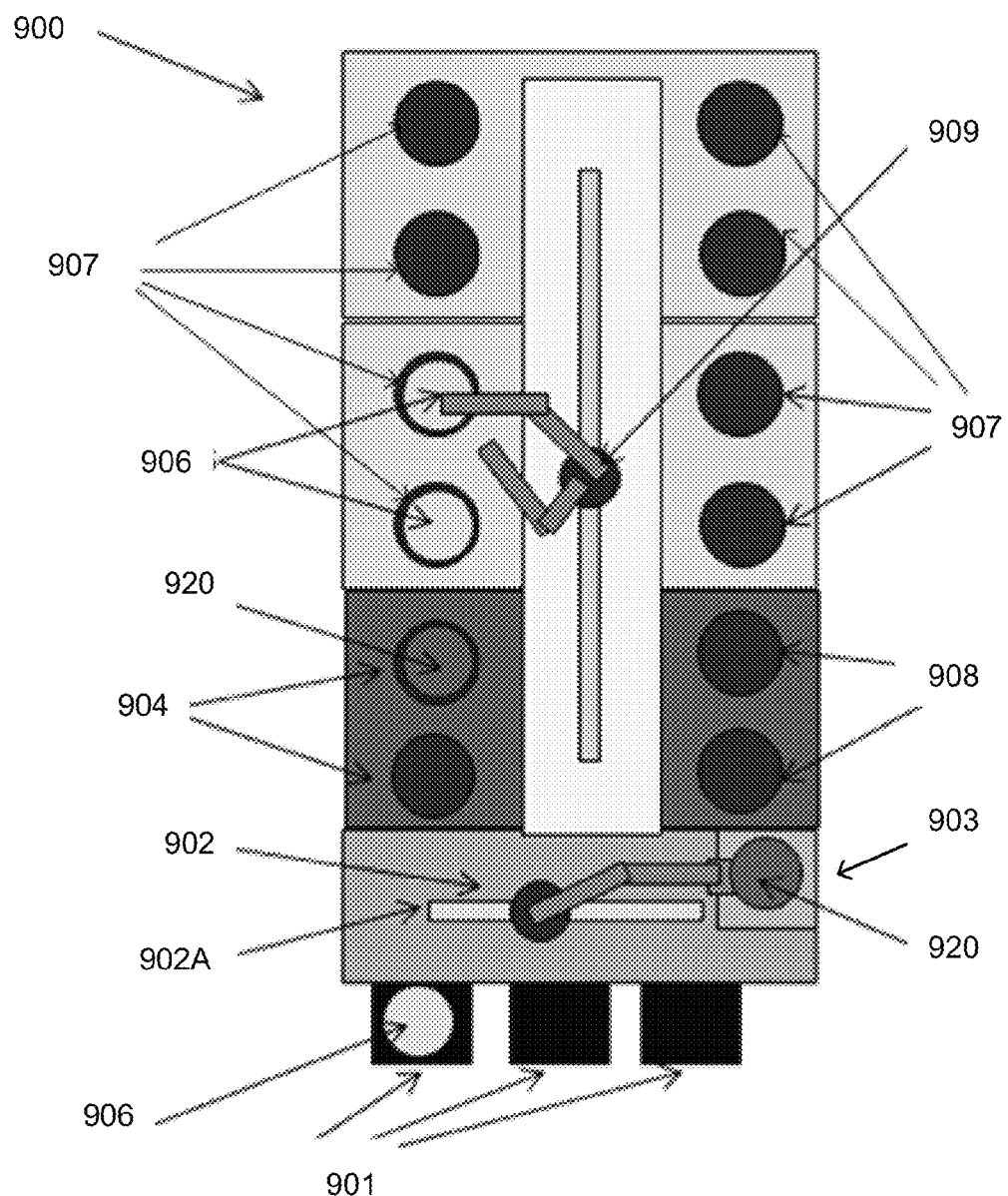
FIG. 9 shows a multi-station process tool according to an embodiment disclosed herein.

Reference is now made to FIG. 9, which is a schematic drawing of one suitable automated wafer plating tool apparatus 900 configured to plate a semiconductor wafer (e.g., silicon) or similar substrate (e.g., glass-coated thinned wafer, GaAs, ceramic, etc.) with various metals and alloys (e.g. copper, nickel, gold, palladium, cobalt, indium, tin, lead, lead-tin, tin-silver, FeCo, etc.), and perform other necessary plating sub-processes (e.g. spin rinsing and drying, metal and silicon wet etching, electroless deposition, pre-wetting and pre-chemical treating, photoresist stripping, surface pre-activation, etc.). The tool is shown schematically looking top down, and shows only a single level or "floor", but it is understood that the tool, such as the Novellus Sabre™ 3D tool, can have two or more levels "stacked" on top of each other including identical or different types of processing stations.

As mentioned, of particular interest are scenarios including plating of tin silver solder alloys, which are known to generally have the problem of creating spurious metal deposits on and around the wafer holding "cup" and lip-seal over time and with use, and which therefore require periodic maintenance to remove and clean the metallic and other film buildup. The spurious plated metal on the sealing area and its vicinity divert and otherwise change the desired pattern of current distribution, and its removal is therefore required to maintain good within wafer uniformity and particle performance.

Substrates 906 that are to be processed are generally fed to the tool through front end loading "FOUP" 901, and in this example are brought from the FOUP 901 to the main substrate processing area of the tool via front end robot 902. Front end robot 902 can retract and move substrates in multiple dimensions from one station to another of the accessible stations, such as two front end accessible module pre-treating stations 904 and cleaning stations 908 as shown in this example. Lateral movement from side to side of the robot carrying the wafer is accomplished by robot track 902A.

After determining that a number of processed substrates 906 in the tin-silver plating cell 907 reaches a predetermined level (e.g., 50 to 200 wafers or more, depending on the deposition rate and charge passed per wafer), the system 900 initiates a cleaning process. Where a detection assembly is used to detect the presence of unwanted deposits, the system 900 may initiate a cleaning process in response to a signal from the detector that cleaning is appropriate. The two plating cells 907 are then denoted as not available for further plating until the cleaning is completed. In a manual operation procedure the cells would need to be denoted as having completed the manual cleaning operation by the operator, but in the automated process, the system software initiates the automatic cleaning sequence and, when complete, allows for further wafer processing through those cells thereafter until the pre-designated cleaning interval or other criteria is met again.

The system may instruct substrate handling robots to extract cleaning disk from the "dummy-wafer" storage area 903, also referred to as a cleaning disk storage holder. Various examples of cleaning disks are described above. Cleaning disk 920 may be retrieved by front end robot 902, handed over to backend robot 909, and transported by backend robot 909 to tin-silver plating station 907. Backend robot 909 may also be used to insert cleaning disk 920 into the electroplating cup/clamshell of plating station 907 as described above and in a manner similar to inserting regular substrates for plating. As with the front end robot 902, the backend robot 909 is also shown having a track and is capable of transporting the substrate 906 or the cleaning disk 920 from the forward pre-treating stations and from either the upper or lower decks of the tool to any other tool station throughout the tool.

Once the backend robot 909 places the cleaning disk into the electroplating cup, the wafer holding cup-clamshell is closed and a seal is made between the edge of the disk and the lip seal as described above. With the cleaning disk in place, the electroplating cup is submerged into the plating cell electrolyte, and the process of deplating is ready to be initiated. The process is initiated by passing an anodic current on the cup side in either a potentiostatic or galvanostatic mode as described above. Suitable rotation speeds range from about 0 to 180 RPM.

Upon completion of the cleaning operations, the cleaning disk 920 is removed from the plating solution, and is optionally spun at a speed of between about 100 to 600 RPM to reclaim the electrolyte off its surface. This is followed an optional DI rinsing operating of the deplating disk at sufficiently high speeds to rinse off remaining electrolyte residue on the wafer surface. The cleaning disc 920 is then cleaned and stored in the storage area 903.

An electroplating apparatus suitable for use with the embodiments herein is further described in U.S. patent application Ser. No. 13/305,384, titled "ELECTROPLATING APPARATUS AND PROCESS FOR WAFER LEVEL PACKAGING," filed on Nov. 28, 2011, which is incorporated by reference herein in its entirety.

The electroplating system may include a system controller for receiving feedback signals from various modules of the system and supplying control signals to the same or other modules. The system controller may control operation of electroplating cups, robots, application of currents, and many other process variables. In certain embodiments, the system controller may synchronize the operation of the electroplating cups and robots with respect to other modules. In more specific embodiments, the system controller may determine when a cleaning process should be initiated in a sequence of plating operations (according to, e.g., a periodic cleaning schedule based on the number of wafers plated, the amount of time passed, the amount of charge passed, or a signal from a detector that cleaning is required).

In the depicted embodiment, the system controller is employed to control process conditions during various operations described above. Some examples of such operations include providing a cleaning disk, sealing the cleaning disk in an electroplating cup, applying a force to the cleaning disk, changing the force applied to the cleaning disk, submerging the electroplating cup into the plating solution, applying reverse current, and ceasing the application of current when the cleaning process is complete.

The system controller will typically include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network.

In certain embodiments, the system controller controls all or most activities of the semiconductor processing system described above. For example, the system controller may control all or most activities of the semiconductor processing system associated with cleaning an electroplating cup from unintended deposits caused by plating alloy materials. The system controller executes system control software including sets of instructions for controlling the timing of the processing steps, pressure levels, flow rates, and other parameters of particular operations further described below. Other computer programs, scripts, or routines stored on memory devices associated with the controller may be employed in some embodiments.

Typically, there is a user interface associated with the system controller. The user interface may include a display screen, graphical software to display process conditions, and user input devices such as pointing devices, keyboards, touch screens, microphones, and other like components.

The computer program code for controlling the above operations can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

The cleaning process of the plating apparatus and lip seal using a cleaning disk are described above with reference to an automated tool and integrated processing approach. It is understood that those skilled in the art would appreciate that other approaches, including certain manual operations, can be substituted to accomplish some of the operations described.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of mitigating an electroplating deposit on a substrate holder that is configured to hold a wafer substrate in an electroplating cell while applying a cathodic current to electroplate metal on the substrate, the method comprising:
when the electroplating cell is not being used for electroplating metal on a substrate, providing a deplating disk in the substrate holder such that the deplating disk makes electrical contact with a plurality of electrical contacts in the substrate holder;
immersing the deplating disk and substrate holder into an electroplating solution within the electroplating cell; and
applying an anodic potential to the deplating disk under conditions sufficient to remove, at least partially, the electroplating deposit from the substrate holder,
wherein the deplating disk has a size and a shape matching those of a standard semiconductor wafer.

2. The method of claim 1, wherein the deplating disk comprises a metal around its perimeter in a region for making said electrical contact with said plurality of electrical contacts in the substrate holder.

3. The method of claim 2, wherein the metal is a noble metal.

4. The method of claim 2, wherein the deplating disk comprises an insulator in a central region of the deplating disk.

5. The method of claim 1, wherein the electroplating deposit on a substrate holder comprises silver and tin.

6. The method of claim 1, wherein the substrate holder comprises a lip seal.

7. The method of claim 6, further comprising compressing the deplating disk on the lip seal to cause the deplating disk to come into electrical contact with the electroplating deposit.

8. The method of claim 7, further comprising:
after applying the anodic potential to the deplating disk, varying compression on the deplating disk to cause the lip seal to flex to a new position and thereby cause the deplating disk to come into electrical contact with the electroplating deposit.

9. The method of claim 1, further comprising moving the deplating disk to a storage area for the deplating disk.

10. A method of cleaning a semiconductor plating apparatus, comprising:
providing a deplating disk in a wafer holder assembly, wherein the deplating disk comprises corrosion-resistant conductive material around at least the periphery of the deplating disk,
said wafer holder assembly comprising a peripheral lip seal and a plurality of electrical contacts, wherein the wafer holder assembly is positioned in an electroplating cell, and wherein the wafer holder assembly has metal deposited thereon, and
sealing the deplating disk in the wafer holder assembly by applying a force to the deplating disk to thereby deform the lip seal and provide a liquid-tight seal, and thereby establish electrical communication between the plurality of electrical contacts and the metal deposited on the wafer holder assembly,
submerging the deplating disk in cleaning solution in the electroplating cell, and
applying anodic current to the deplating disk to thereby remove metal deposited on the wafer holder assembly.

11. The method of claim 10, further comprising changing the force applied to the deplating disk as current is applied to further deform the lip seal and thereby provide new electrical connections between the deplating disk and metal deposited on the wafer holder assembly.

12. The method of claim 10, wherein the force applied to the deplating disk is the same as a force applied to a plating wafer when a plating wafer is sealed in the wafer holder assembly.

13. The method of claim 10, wherein the force applied to the deplating disk is different from a force applied to a plating wafer when a plating wafer is sealed in the wafer holder assembly.

14. The method of claim 10, wherein the deplating disk comprises an insulated center portion.

15. The method of claim 10, wherein the metal deposited on the wafer holder assembly comprises an alloy.

16. The method of claim 15, wherein the alloy comprises tin and silver.

17. The method of claim 15, wherein applying anodic current to the deplating disk comprises:
applying current at a first voltage potential, and
applying current at a second voltage potential, wherein the first potential corresponds to a potential that is slightly beyond the voltage potential of a metal in the alloy.

18. The method of claim 10, wherein the cleaning solution is the same as a solution used for electroplating a plating wafer.

19. The method of claim 18, wherein anodic current is applied to the deplating disk in a potentiostatic mode.

20. The method of claim 19, wherein anodic current is applied to the deplating disk until a target current density is reached.

21. The method of claim 10, wherein when applying anodic current to the deplating disk, the current density is controlled to avoid oxygen generation.

22. The method of claim 10, wherein anodic current is applied to the deplating disk in a galvanostatic mode.

23. The method of claim 22, wherein a current density is between about 0.05-2 Amps per square decimeter.

24. The method of claim 10, wherein anodic current is applied to the deplating disk in pulses.

25. The method of claim 10, further comprising rotating the deplating disk at about 30 RPM or greater during at least the applying current operation.

26. The method of claim 10, wherein the deplating disk is rotated in a first direction and then in a second direction.

27. The method of claim 10, further comprising:
removing the deplating disk from the cleaning solution;
spinning the deplating disk between about 100-600 RPM to reclaim the cleaning solution from the deplating disk;
rinsing the deplating disk with deionized water; and
spinning the deplating disk to remove the deionized water.

28. The method of claim 10, further comprising repeating the method periodically.

29. The method of claim 28, wherein the method is repeated after a time interval.

* * * * *